(12) United States Patent
More

(10) Patent No.: US 12,283,624 B2
(45) Date of Patent: Apr. 22, 2025

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventor: Shahaji B. More, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 480 days.

(21) Appl. No.: 17/586,705

(22) Filed: Jan. 27, 2022

(65) Prior Publication Data

US 2023/0023936 A1    Jan. 26, 2023

Related U.S. Application Data

(60) Provisional application No. 63/224,835, filed on Jul. 22, 2021.

(51) Int. Cl.
*H01L 29/66* (2006.01)
*H01L 21/02* (2006.01)
*H01L 21/8234* (2006.01)
*H01L 29/78* (2006.01)

(52) U.S. Cl.
CPC .. *H01L 29/66795* (2013.01); *H01L 21/02315* (2013.01); *H01L 21/02334* (2013.01); *H01L 21/823431* (2013.01); *H01L 29/785* (2013.01)

(58) Field of Classification Search
CPC ......... H01L 29/66795; H01L 21/02315; H01L 21/02334; H01L 21/823431; H01L 29/785; H01L 27/0886; H01L 29/6681; H01L 21/3065; H01L 21/02057
See application file for complete search history.

(56) References Cited

U.S. PATENT DOCUMENTS

| | | | |
|---|---|---|---|
| 2017/0207126 A1* | 7/2017 | Ching | H01L 21/31111 |
| 2018/0342621 A1* | 11/2018 | Lin | H01L 21/26513 |
| 2019/0067444 A1* | 2/2019 | Ching | H01L 21/02532 |
| 2019/0067454 A1* | 2/2019 | Hsu | H01L 21/823842 |
| 2020/0083219 A1* | 3/2020 | Kang | H01L 29/0653 |
| 2020/0161188 A1* | 5/2020 | Liao | H01L 27/0886 |
| 2020/0176611 A1* | 6/2020 | Lee | H01L 29/401 |

* cited by examiner

*Primary Examiner* — S M Sohel Imtiaz
(74) *Attorney, Agent, or Firm* — STUDEBAKER BRACKETT PLLC

(57) ABSTRACT

In a method of manufacturing a semiconductor device, a first fin structure, a second fin structure, a first wall fin structure and a second wall fin structure are formed over a substrate. The first and second fin structures are disposed between the first and second wall fin structures, and lower portions of the first and second fin structures and the first and second wall fin structures are embedded in the isolation insulating layer and upper portions thereof are exposed from the isolation insulating layer. A sidewall spacer layer is formed on sidewalls of the first and second fin structures. Source/drain regions of the first and second fin structures are recessed. An epitaxial source/drain structure is formed over the recessed first and second fin structures. A width W1 of the first and second fin structures is smaller than a thickness W2 of the sidewall spacer layer.

20 Claims, 29 Drawing Sheets

METHOD OF MANUFACTURING A SEMICONDUCTOR DEVICE AND A SEMICONDUCTOR DEVICE

RELATED APPLICATION

This application claims priority to U.S. Provisional Patent Application No. 63/224,835 filed Jul. 22, 2021, the entire contents of which are incorporated herein by reference.

BACKGROUND

The disclosure relates to a semiconductor integrated circuit, and more particularly to a semiconductor device having an epitaxial source/drain (S/D) structure with voids and its manufacturing process. As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
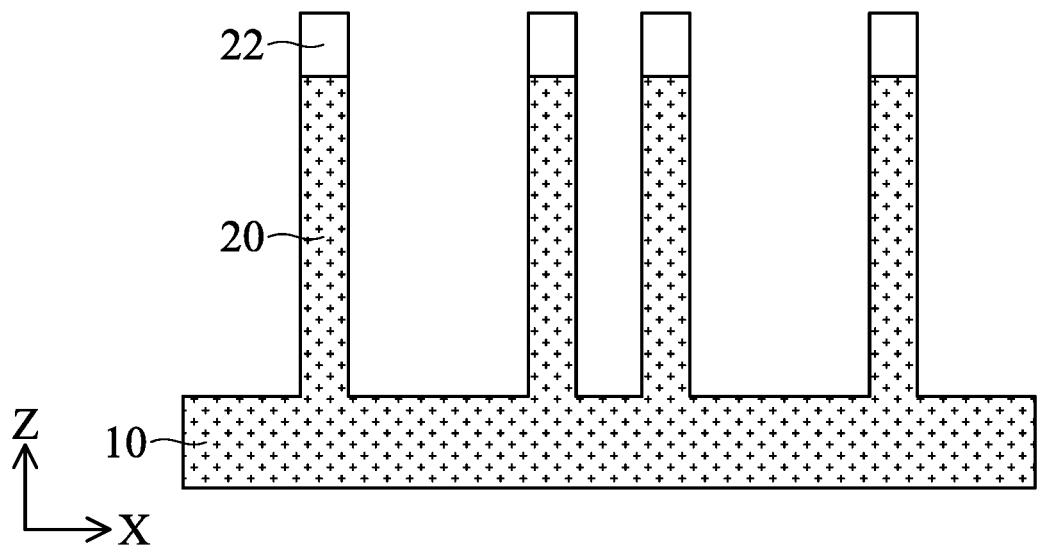
FIG. 1 shows a cross sectional view of one of the various stages of a manufacturing operation for a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted.

Disclosed embodiments relate to a semiconductor device and its manufacturing method, in particular, source/drain regions of a field effect transistor (FET). The embodiments such as those disclosed herein are generally applicable not only to FinFETs but also other FETs.

FIGS. 1-6B show views of various stages of a sequential manufacturing operation of a semiconductor device according to the present disclosure. It is understood that additional operations may be provided before, during, and after the processes shown by FIGS. 1-6B, and some of the operations described below can be replaced or eliminated for additional embodiments of the method. The order of the operations/processes may be interchangeable.

As shown in FIG. 1, one or more fin structures 20 are fabricated over a substrate 10. The substrate 10 is, for example, a p-type silicon substrate with an impurity concentration in a range of about $1 \times 10^{15}$ cm$^{-3}$ to about $1 \times 10^{18}$ cm$^{-3}$. In other embodiments, the substrate 10 is an n-type silicon substrate with an impurity concentration in a range of about $1 \times 10^{15}$ cm$^{-3}$ to about $1 \times 10^{18}$ cm$^{-3}$. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structures 20 may be patterned by any suitable method. For example, the fin structures 20 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 20. In some embodiments, a hard mask pattern 22 used to etch the substrate 10 remains on the top of the fin structure 20. The hard mask pattern 22 includes one or more layers of silicon oxide, silicon nitride, SiON and other suitable material, in some embodiments. In certain embodiments, the hard mask pattern 22 includes silicon nitride.

As shown in FIG. 1, four fin structures 20 protrude from the substrate 10 toward the Z direction, extend in the Y direction and are disposed adjacent to each other in the X direction with a constant pitch. However, the number of the fin structures is not limited to four. The numbers may be one, two, three, five or more. In addition, one or more dummy fin structures may be disposed adjacent to both sides of the fin structures 20 to improve pattern fidelity in patterning processes. The width of the fin structure 20 is in a range of about 5 nm to about 40 nm in some embodiments, and is in a range of about 7 nm to about 15 nm in certain other embodiments. The height of the fin structure 20 is in a range of about 100 nm to about 300 nm in some embodiments, and is in a range of about 50 nm to 100 nm in other embodiments. The space between the fin structures 20 is in a range of about 5 nm to about 80 nm in some embodiments, and is in a range of about 7 nm to 20 nm in other embodiments. In some embodiments, a pitch of the fin structures is in a range from about 10 nm to 120 nm, and is in a range from about 14 nm to about 35 nm in other embodiments. One skilled in the art will realize, however, that the dimensions and values recited throughout the descriptions are merely examples, and may be changed to suit different scales of integrated circuits. In some embodiments, the Fin FET device is an n-type Fin FET. In other embodiments, the Fin FET device is a p-type Fin FET.

Figure 2:
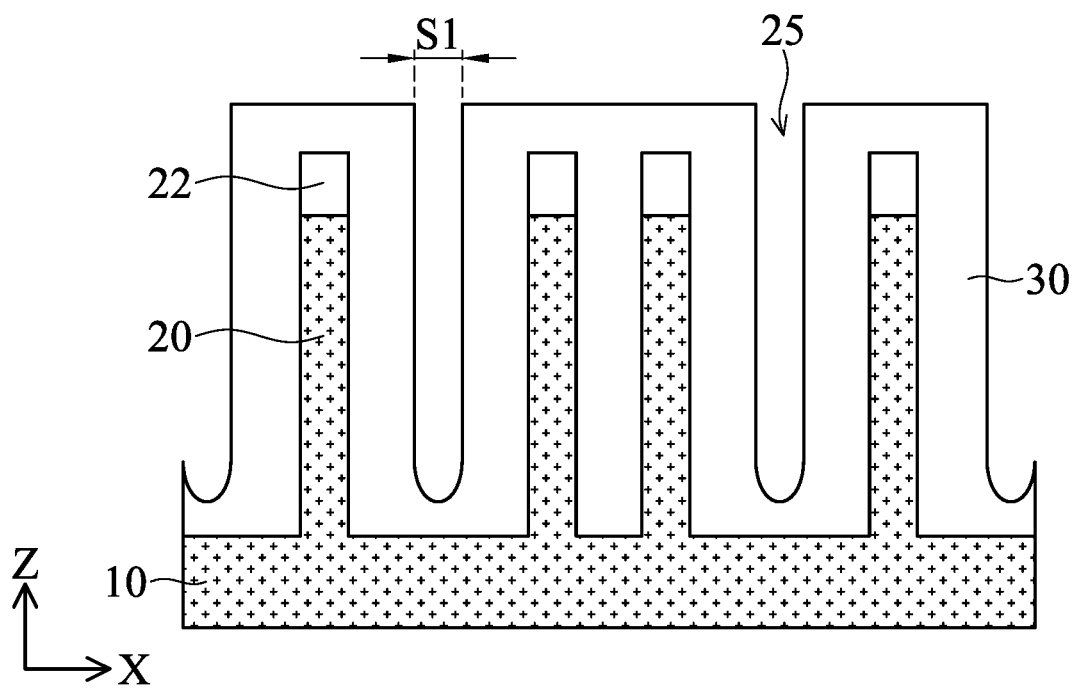
FIG. 2 shows a cross sectional view of one of the various stages of a manufacturing operation for a semiconductor device according to an embodiment of the present disclosure.

After the fin structures 20 are formed, a first dielectric layer 30 is formed over the fin structures 20 as shown in FIG. 2. The first dielectric layer 30 includes one or more layers of insulating materials such as silicon oxide, silicon oxynitride, silicon nitride, SiOC, SiCN or SiOCN, formed by LPCVD (low pressure chemical vapor deposition), plasma-CVD or atomic layer deposition (ALD), or any other suitable film formation method. In certain embodiments, silicon oxide is used as the first dielectric layer 30. In some embodiments, as shown in FIG. 2, the first dielectric layer 30 is conformally formed over the fin structures 20 such that a first space 25 is formed between adjacent fin structures. The thickness of the first dielectric layer 30 is adjusted so that the space Si is in a range of about 5 nm to about 40 nm in some embodiments, and is in a range of about 7 nm to about 15 nm in certain embodiments.

Figure 3A:
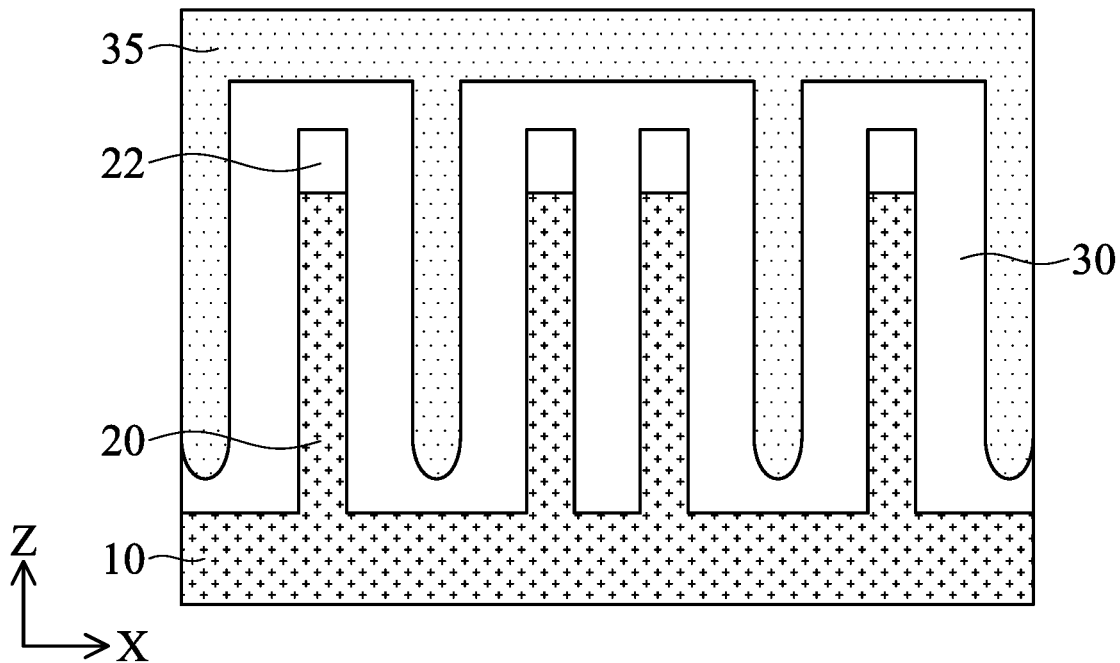
FIGS. 3A and 3B show cross sectional views of one of the various stages of a manufacturing operation for a semiconductor device according to an embodiment of the present disclosure.

After the first dielectric layer 30 is formed, a second dielectric layer 35 is formed over the first dielectric layer 30, as shown in FIG. 3A. The material of the second dielectric layer 35 is different from the material of the first dielectric layer 30. In some embodiments, the second dielectric layer 35 includes one or more layers of insulating materials such as silicon oxide, silicon oxynitride or silicon nitride, SiOC, SiCN or SiOCN formed by LPCVD, plasma-CVD or ALD, or any other suitable film formation method. In some embodiments, the second dielectric layer 35 is made of silicon nitride. As shown in FIG. 3A, the second dielectric layer 35 fully fills the first space 25 and covers the top of the first dielectric layer 30, in some embodiments. In other embodiments, a void is formed in the bottom part of the first space 25.

Figure 3B:
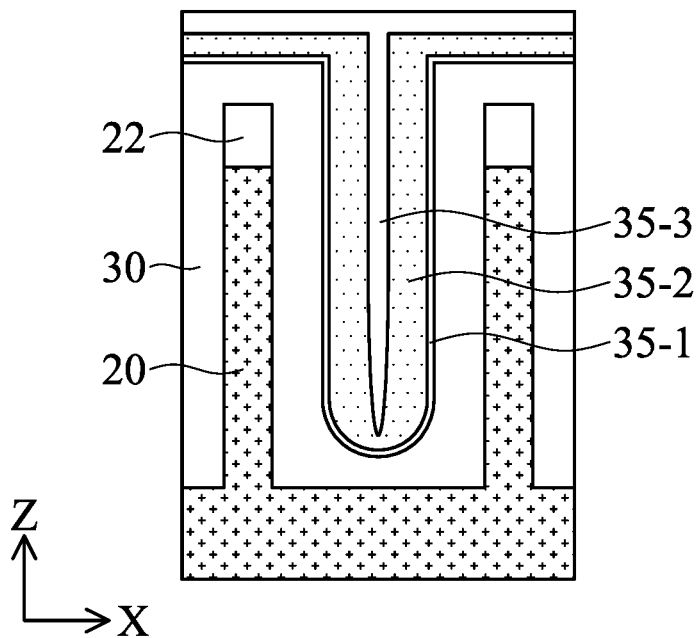

In some embodiments, the second dielectric layer 35 includes a first layer 35-1, a second layer 35-2 and a third layer 35-3, as shown in FIG. 3B. In some embodiments, the first layer 35-1 is a liner layer and includes one of silicon oxide, silicon oxynitride, silicon nitride, SiOC, SiCN or SiOCN, formed by LPCVD (low pressure chemical vapor deposition), plasma-CVD or atomic layer deposition (ALD), or any other suitable film formation method. In certain embodiments, SiCN or SiOCN is used as the first layer 35-1. In some embodiments, as shown in FIG. 3B, the first layer 35-1 is conformally formed over the first dielectric layer 30 such that a space is formed between adjacent fin structures. The thickness of the first layer 35-1 is in a range of about 2.0 nm to about 20 nm in some embodiments, and is in a range from about 5 nm to about 10 nm in other embodiments.

In some embodiments, the material of the second layer 35-2 is different from the material of the first layer 35-1. In some embodiments, the second layer 35-2 includes one of silicon oxide, silicon oxynitride, silicon nitride, SiOC, SiCN or SiOCN formed by LPCVD, plasma-CVD or ALD, or any other suitable film formation method. In some embodiments, the second layer 35-2 is made of silicon nitride or silicon oxide. When silicon oxide is used, the second layer 35-2 is formed by, for example, a flowable CVD process followed by a thermal annealing process at 400° C. to 800° C. in an inert gas ambient. The thickness of the second layer 35-2 is in a range of about 2.0 nm to about 50 nm in some embodiments. In some embodiments, the second layer 35-2 is thicker than the first layer 35-1.

In some embodiments, the third layer 35-3 includes one of silicon oxide, silicon oxynitride, silicon nitride, SiOC, SiCN or SiOCN formed by LPCVD, plasma-CVD or ALD, or any other suitable film formation method. In some embodiments, the third layer 35-3 is made of silicon oxide, which is formed by a plasma CVD process. The thickness of the third layer 35-3 is in a range of about 2 nm to about 30 nm in some embodiments. As shown in FIG. 3B, the third layer 35-3 fully fills the space between adjacent fin structures, in some embodiments. In other embodiments, the second layer 35-2 fully fills the space and no third layer is formed. In some embodiments, the second layer 35-2 is thicker than the third layer 35-3. In some embodiments, the second layer 35-2 is thicker than each of the first layer 35-1 and the third layer 35-3. In other embodiments, the second layer 35-2 is thicker than the combination of the first layer 35-1 and third layer 35-3.

Figure 3C:
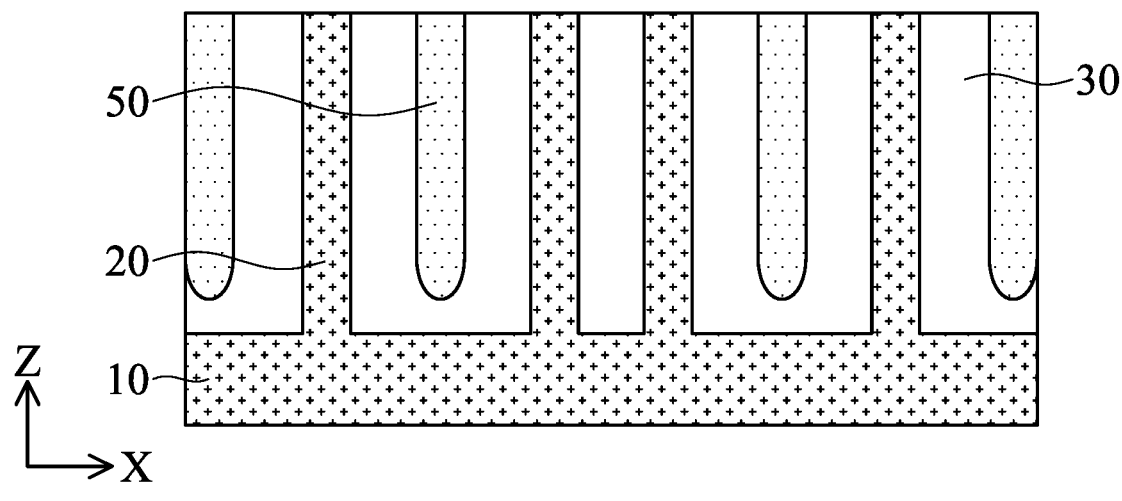
FIG. 3C shows a cross sectional view of one of the various stages of a manufacturing operation for a semiconductor device according to an embodiment of the present disclosure.

In some embodiments, after the second dielectric layer 35 is formed, a planarization operation, such as an etch-back process or a chemical mechanical polishing (CMP) process, is performed to planarize the upper surface of the second dielectric layer 35, thereby forming wall fin structure 50 as shown in FIG. 3C.

Figure 4:
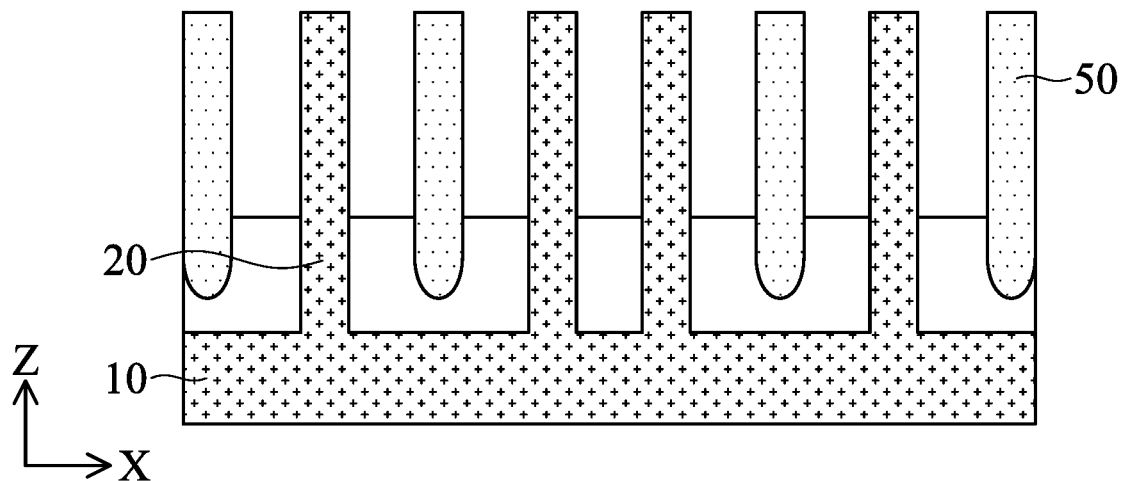
FIG. 4 shows a cross sectional view of one of the various stages of a manufacturing operation for a semiconductor device according to an embodiment of the present disclosure.

Then, the first dielectric layer 30 is recessed down to expose the upper portion (channel region) of the fin structures 20 by using a suitable dry and/or wet etching operation, as shown in FIG. 4. Since the first dielectric layer 30 is made of a different material than the second dielectric layer 35, the first dielectric layer 30 is selectively etched against the second dielectric layer. The recessed first dielectric layer 30 functions as an isolation insulating layer (e.g., shallow trench isolation (STI)) to electrically isolation one fin structure from adjacent fin structures.

In some embodiments, the wall fin structure (dummy fin) 50 includes a third dielectric layer formed on a recessed second dielectric layer 35, as a hybrid fin structure. In some embodiments, the second dielectric layer 35 is recessed and a third dielectric layer is formed over the recessed second dielectric layer. The material of the third dielectric layer is different from the materials of the first dielectric layer 30 and the second dielectric layer 35. In some embodiments, the third dielectric layer includes a material having a lower etching rate than the second dielectric layer against a polysilicon etching. In some embodiments, the third dielectric layer includes a high-k dielectric material. In some embodiments, the third dielectric layer includes a dielectric material having a higher dielectric constant (k) than the second dielectric layer 35 and/or the first dielectric layer 30. When the upper surface of the recessed second dielectric layer 35 has a V-shape or a U-shape, the bottom of the third dielectric layer has a V-shape or a U-shape. In some embodiments, the third dielectric layer includes one or more of non-doped hafnium oxide (e.g., $HfO_x$, $0<x\leq2$), hafnium oxide doped with one or more other elements (e.g., HfSiO, HfSiON, HfTaO, HfTiO or HfZrO), zirconium oxide, aluminum oxide, titanium oxide, and a hafnium dioxide-alumina ($HfO_2$—$Al_2O_3$) alloy. In certain embodiments, hafnium oxide ($HfO_x$) is used as the third dielectric layer.

Figure 5:
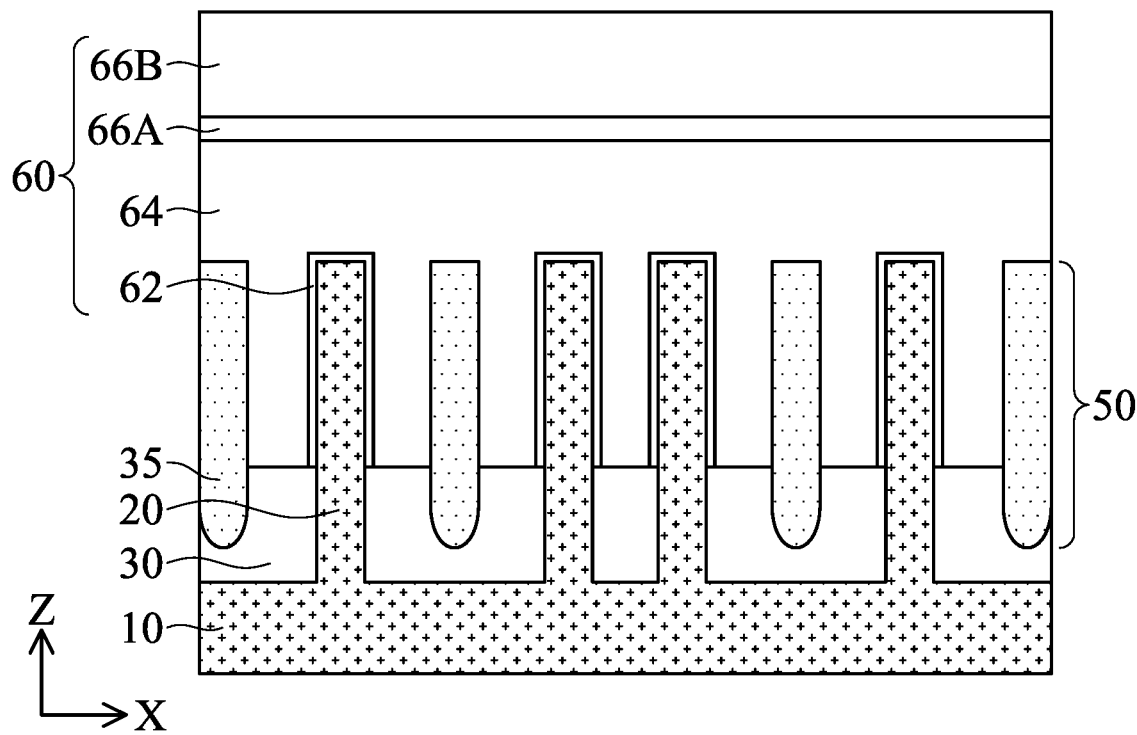
FIG. 5 shows a cross sectional view of one of the various stages of a manufacturing operation for a semiconductor device according to an embodiment of the present disclosure.

Subsequently, a sacrificial gate structure 60 is formed over channel regions of the fin structures 20 and the wall fins 50, as shown in FIG. 5. The sacrificial gate structure 60 includes a sacrificial gate dielectric layer 62 and a sacrificial gate electrode layer 64. In some embodiments, the sacrificial gate structure 60 further includes a hard mask layer over the sacrificial gate electrode layer 64. In some embodiments, the hard mask layer includes a first hard mask layer 66A and a second hard mask layer 66B.

Figure 6A:
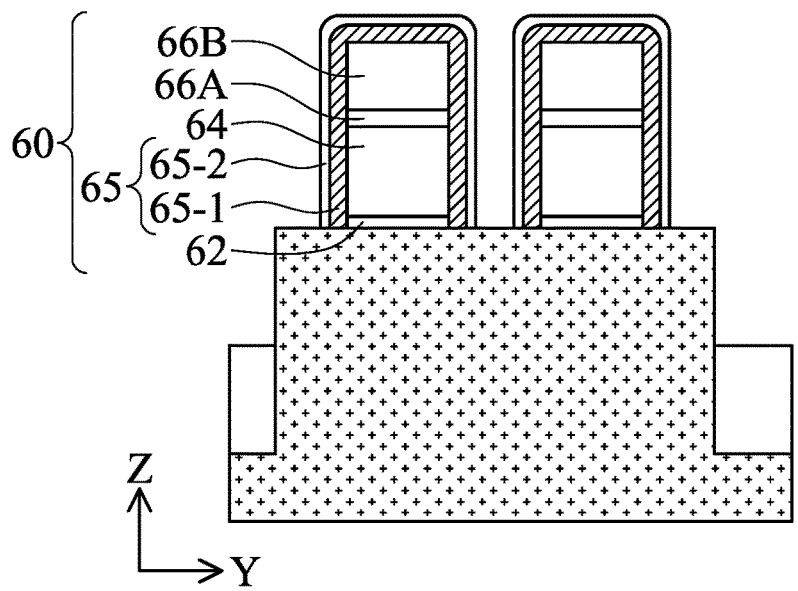
FIGS. 6A and 6B show views of one of the various stages of a manufacturing operation for a semiconductor device according to an embodiment of the present disclosure.
Figure 6B:
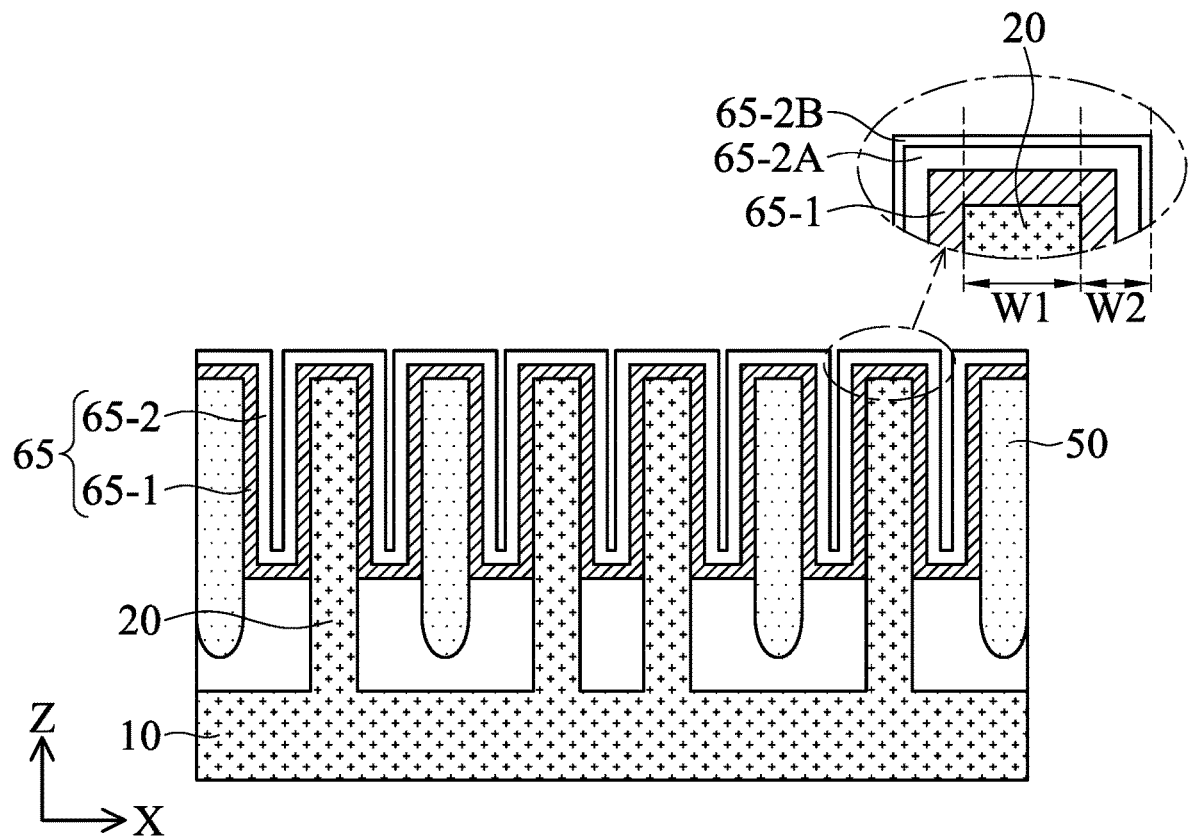

A blanket layer for the sacrificial gate dielectric layer and a blanket polysilicon layer are formed over the isolation insulating layer 30, the fin structures 20 and the wall fin structure 50, and then patterning operations are performed so as to obtain the sacrificial gate structure 60 as shown in FIGS. 6A and 6B. The patterning of the polysilicon layer is performed by using a hard mask including a silicon nitride layer as the first hard mask layer 66A and an oxide layer as the second hard mask layer 66B in some embodiments. In other embodiments, the first hard mask layer 66A may be silicon oxide and the second hard mask layer 66B may be silicon nitride. The sacrificial gate dielectric layer 62 is formed by oxidation in some embodiments. In other embodiments, the sacrificial gate dielectric layer 62 is formed by CVD, PVD, ALD, e-beam evaporation, or other suitable film deposition process. In such a case, the sacrificial gate dielectric layer 62 is also formed on the isolation insulating layer 30 and the wall fin structure 50 and is formed between the sidewall spacers 65 and the fin structure 20. In some embodiments, a thickness of the sacrificial gate dielectric layer 62 is in a range of about 1 nm to about 5 nm.

The width of the sacrificial gate structure 60 is in a range of about 5 nm to about 40 nm in some embodiments, and is in a range of about 7 nm to about 15 nm in certain embodiments.

Further, gate sidewall spacers 65 are formed on side faces of the sacrificial gate structures 60 as shown in FIGS. 6A and 6B. An insulating material layer for the gate sidewall spacers 65 is formed over the sacrificial gate structure 60. The insulating material layer is deposited in a conformal manner so that it is formed to have substantially equal thicknesses on vertical surfaces, such as the sidewalls, horizontal surfaces, and the top of the sacrificial gate structure 60, respectively. In some embodiments, the insulating material layer is also formed on vertical surfaces, such as the sidewalls, horizontal surfaces, and the top of the source/drain region of the fin structures 20 and wall fin structures 50 as shown in FIG. 6B.

The insulating material layer includes one or more of SiN, SiON, SiCON and SiCN or any other suitable dielectric material. The insulating material layer can be formed by ALD or CVD, or any other suitable method.

The insulating material layer includes a first layer 65-1 and a second layer 65-2 in some embodiments. In some embodiments, the first layer 65-1 is made of SiCON and the second layer 65-2 is made of SiCN. In some embodiments, a carbon concentration of the first layer (SiCON) 65-1 is in a range from about 6 atomic % to about 18 atomic %, and an oxygen concentration of the first layer (SiCON) 65-1 is in a range from about 20 atomic % to about 45 atomic %. In some embodiments, the second layer 65-2 includes a first SiCN layer 65-2A and a second SiCN layer 65-2B having a higher nitrogen concentration than the first SiCN layer, which results in a higher etching resistance than the first SiCN layer. In some embodiments, a carbon concentration of the first layer 65-1 is smaller than a carbon concentration of the second layer 65-2. In other embodiments, the carbon concentration of the first layer 65-1 is greater than the carbon concentration of the second layer 65-2.

In some embodiments, the first layer 65-1 is thicker than the second layer 65-2. In some embodiments, the thickness of the first layer 65-1 is in a range from about 3 nm to about 20 nm and the thickness of the second layer 65-2 is in a range from about 2.5 nm to about 15 nm. In some embodiments, the thickness W2 of the gate sidewall spacer 65 is greater than the width W1 of the fin structure. In some embodiments, W2/W1 is in a range from about 1.1 to about 4.0.

In some embodiments, horizontal portions of the insulating material layer are removed by anisotropic etching, thereby forming the gate sidewall spacers 65. In some embodiments, the gate sidewall spacers 65 include two to four layers of different insulating materials.

In some embodiments, gate sidewall spacers having one or more layers are formed by deposition and anisotropic etching, and then the first layer 65-1 and the second layer 65-2 are formed. In some embodiments, one or more insulating layers are formed below the first layer, between the first layer and second layer and/or on the second layer.

FIGS. 7A-7C to 12A-12C show views of various stages of a sequential manufacturing operation of a semiconductor device for forming a source/drain epitaxial layer, subsequent to the manufacturing operations as explained with FIGS. 1-6B, according to the present disclosure. It is understood that additional operations may be provided before, during, and after the processes shown by FIGS. 7A-12C, and some of the operations described below can be replaced or eliminated for additional embodiments of the method. The order of the operations/processes may be interchangeable. In FIGS. 7A-7C to 12A-12C, the "A" figures (FIG. 7A, 8A, . . . ) show cross sectional views along the Y direction (source-to-drain direction), the "B" figures (FIGS. 7B, 8B, . . . ) show cross sectional views along the X direction of an n-type FET region, and the "C" figures (FIGS. 7C, 8C, . . . ) show cross sectional views along the X direction of a static random access memory (SRAM) region, according to some embodiments.

Figure 7A:
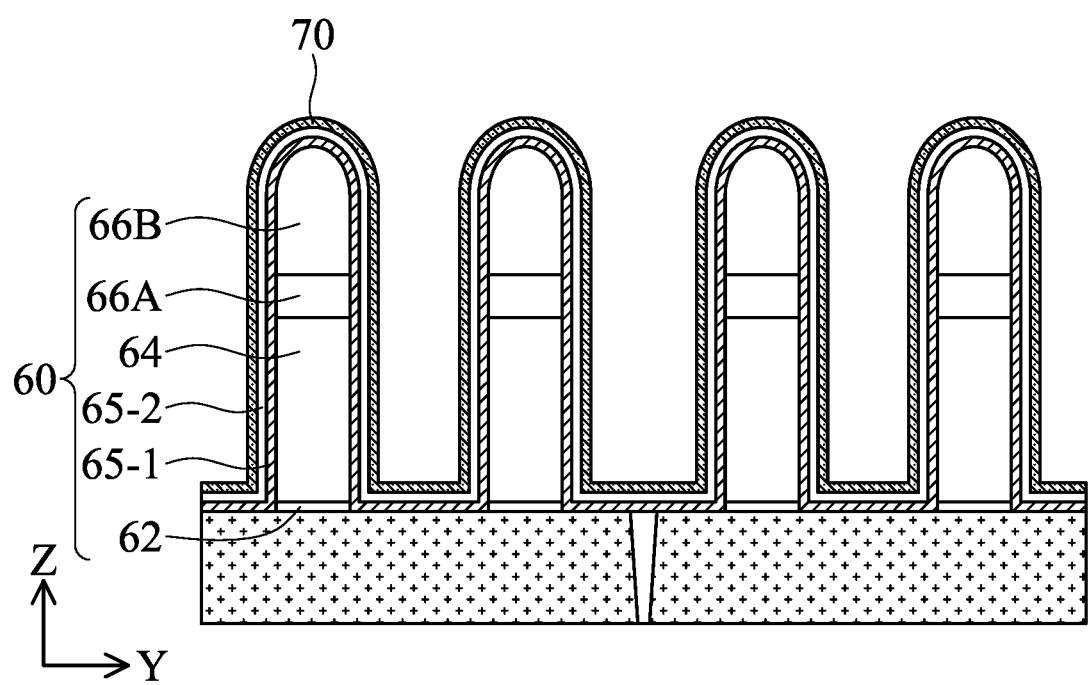
FIGS. 7A, 7B and 7C show cross sectional views of one of the various stages of a manufacturing operation for a semiconductor device according to an embodiment of the present disclosure.
Figure 7B:
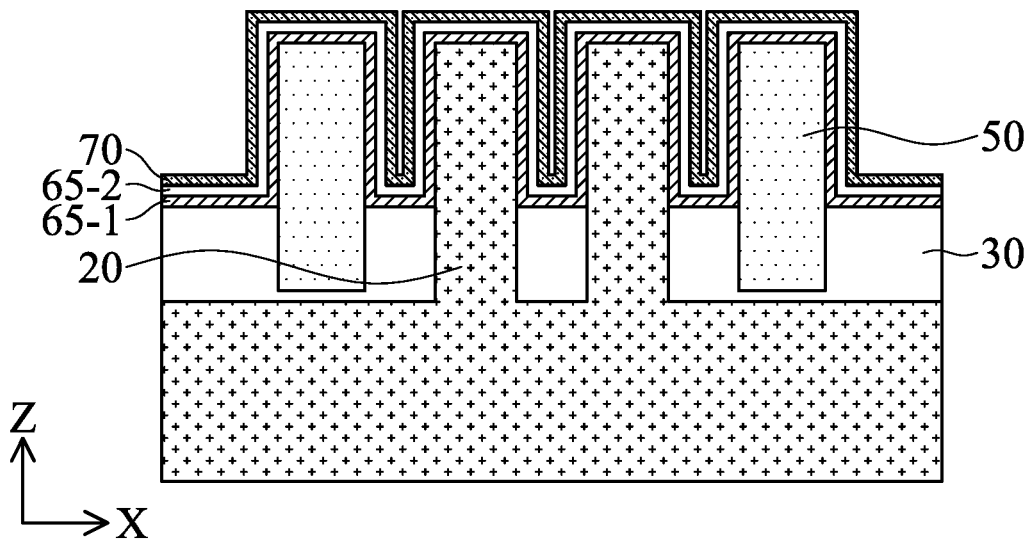
Figure 7C:
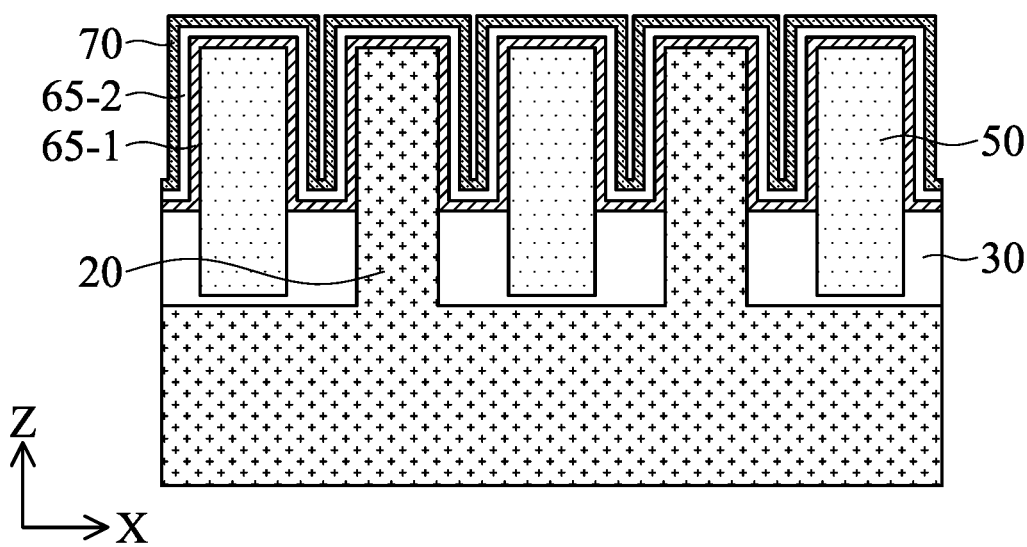

As shown in FIGS. 7A-7C, a cover layer 70 is formed over the sacrificial gate structure and the source/drain region of the fin structure. In some embodiments, the cover layer 70 includes silicon nitride having thickness in a range from about 2 nm to about 20 nm.

Figure 8A:
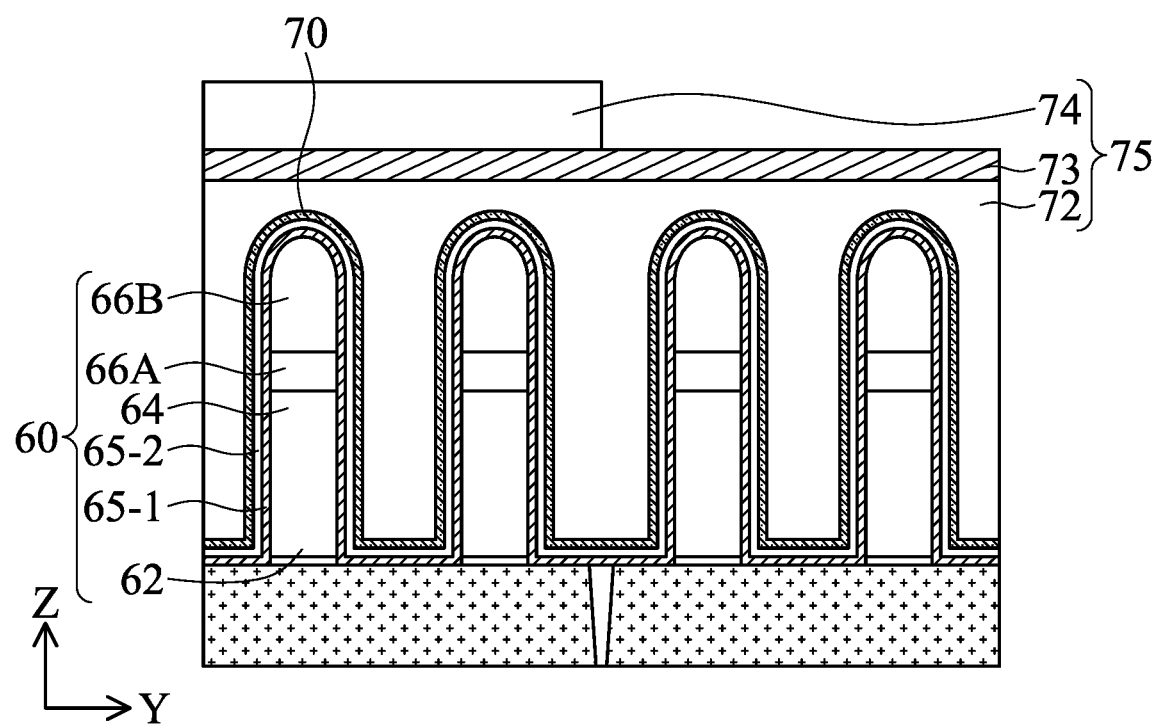
FIGS. 8A, 8B and 8C show cross sectional views of one of the various stages of a manufacturing operation for a semiconductor device according to an embodiment of the present disclosure.
Figure 8B:
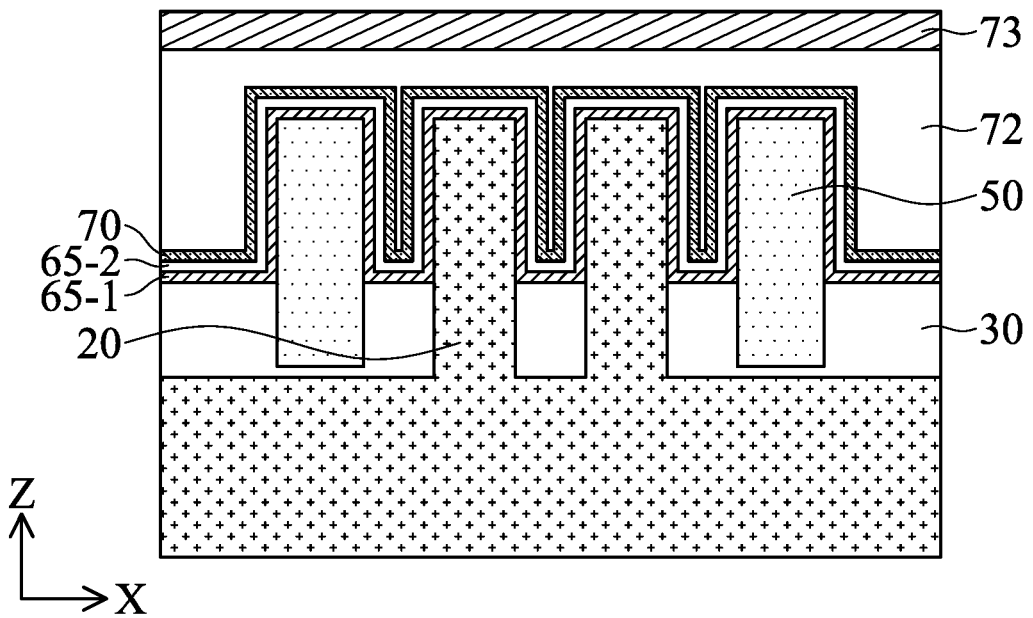
Figure 8C:
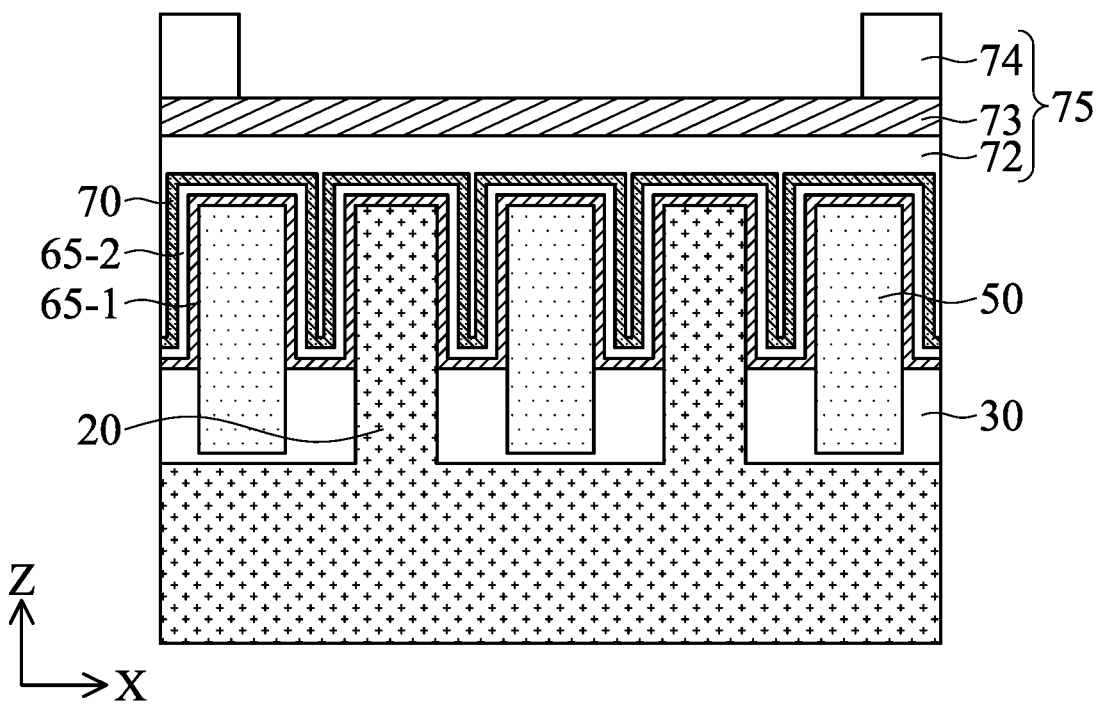

Then, as shown in FIGS. 8A-8C, a resist layer 75 is formed over the cover layer. In some embodiments, the resist layer 75 is a tri-layer system including a bottom antireflective layer 72, a middle layer 73 and a photo resist layer 74. In some embodiments, as shown in FIGS. 8A-8C, a p-type FET region is covered by the photo resist pattern 74.

Figure 9A:
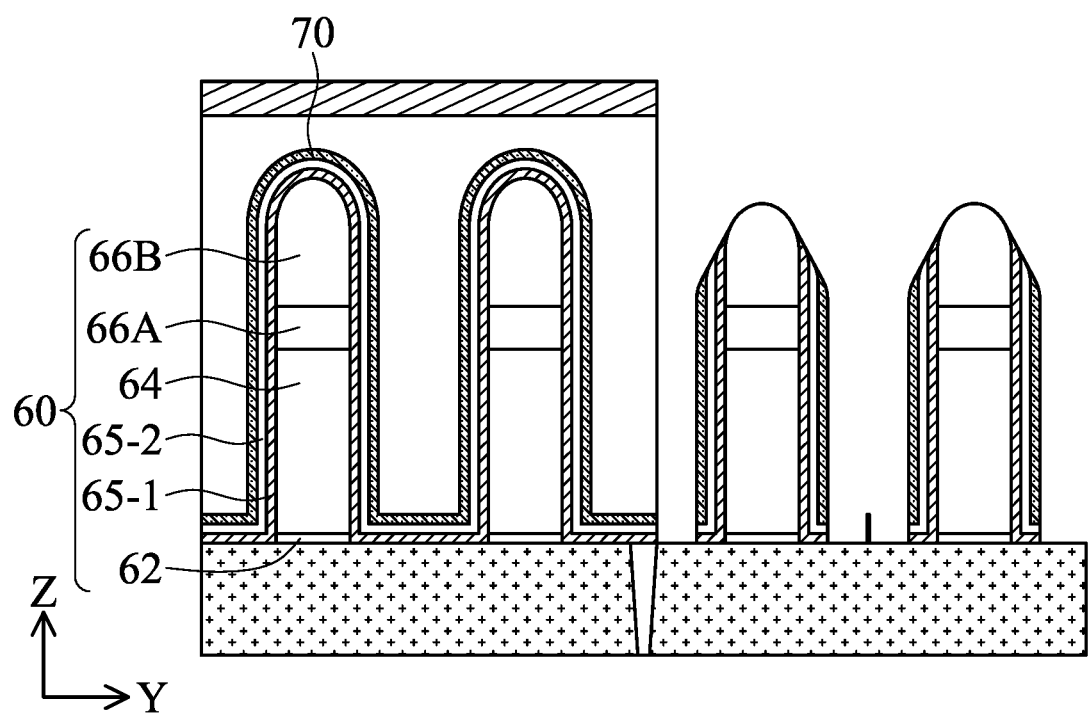
FIGS. 9A, 9B and 9C show cross sectional views of one of the various stages of a manufacturing operation for a semiconductor device according to an embodiment of the present disclosure.
Figure 9B:
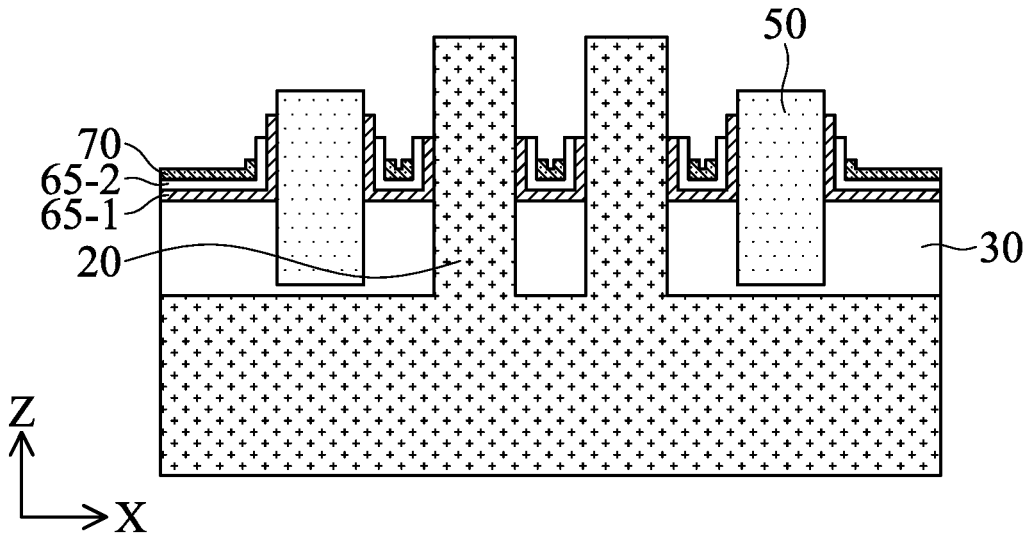
Figure 9C:
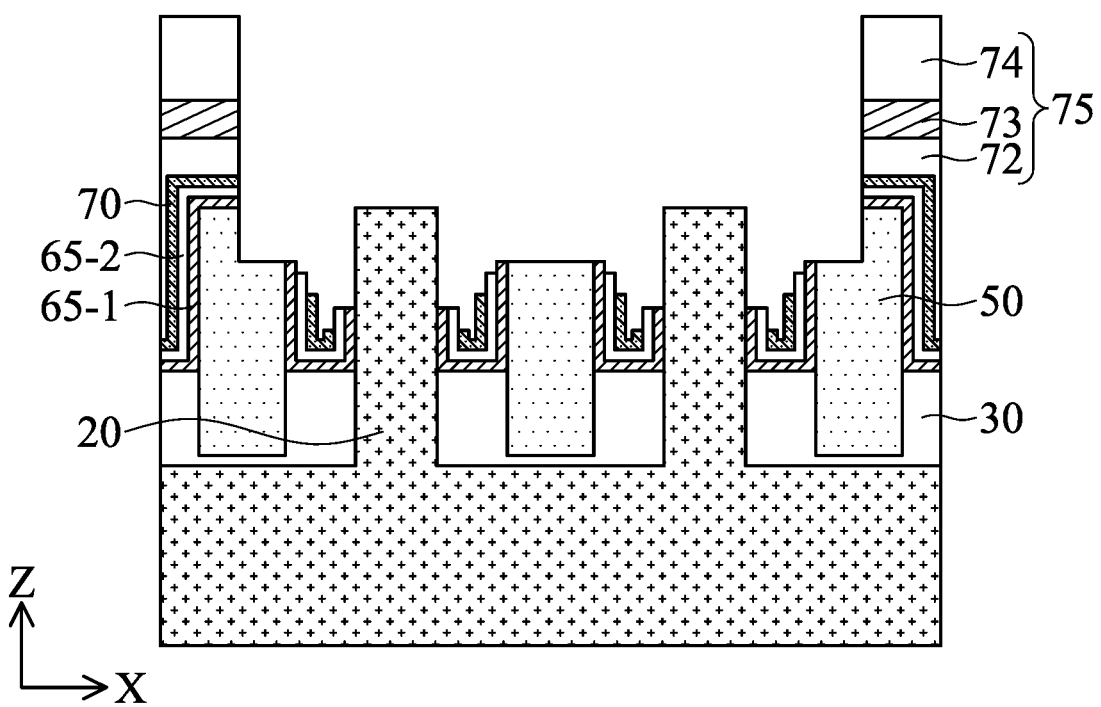

Next, by using or more etching operations, the cover layer 70, and the sidewall spacer layers 65-1 and 65-2 are etched in the n-type region to expose upper portions of the fin structure 20 and the wall fin structures 50, as shown in FIG. 9A-9C. As shown in FIGS. 9A-9C, part of the cover layer 70, the first layer 65-1 and the second layer 65-2 remain on vertical side faces of the sacrificial gate structures and at bottom of the upper portions of the fin structures and the wall fin structure. Further, part of the cover layer 70, the first layer 65-1 and the second layer 65-2 remain on the upper surface of the isolation insulating layer 30. In some embodiments, a part of the wall fin structures 50 is also etched.

Figure 10A:
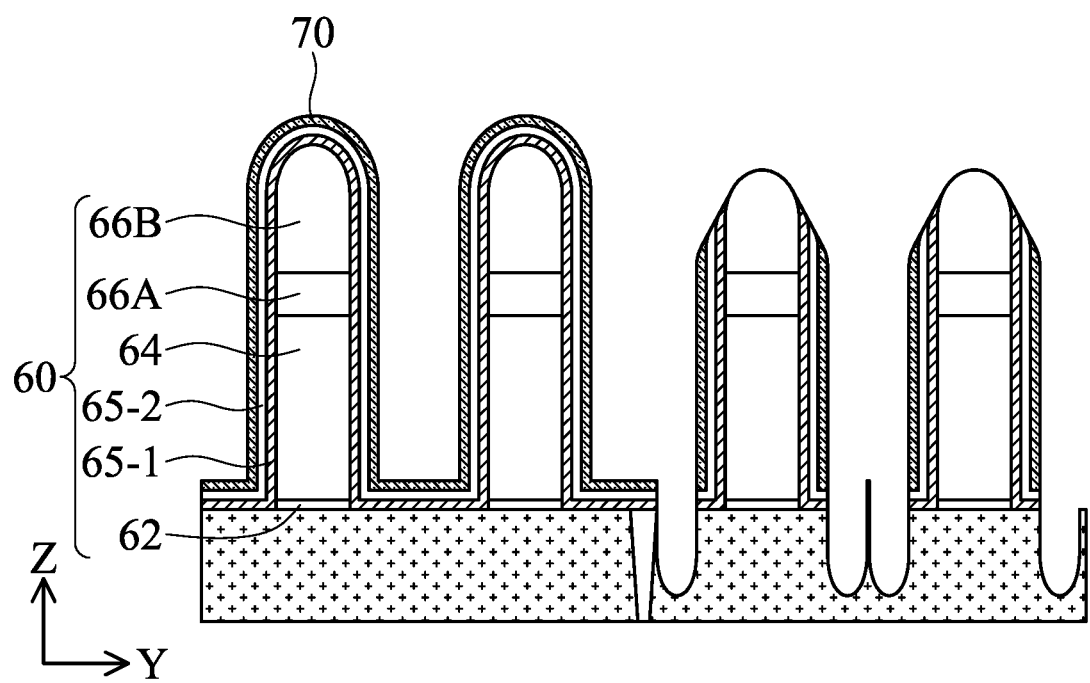
FIGS. 10A, 10B and 10C show cross sectional views of one of the various stages of a manufacturing operation for a semiconductor device according to an embodiment of the present disclosure.
Figure 10B:
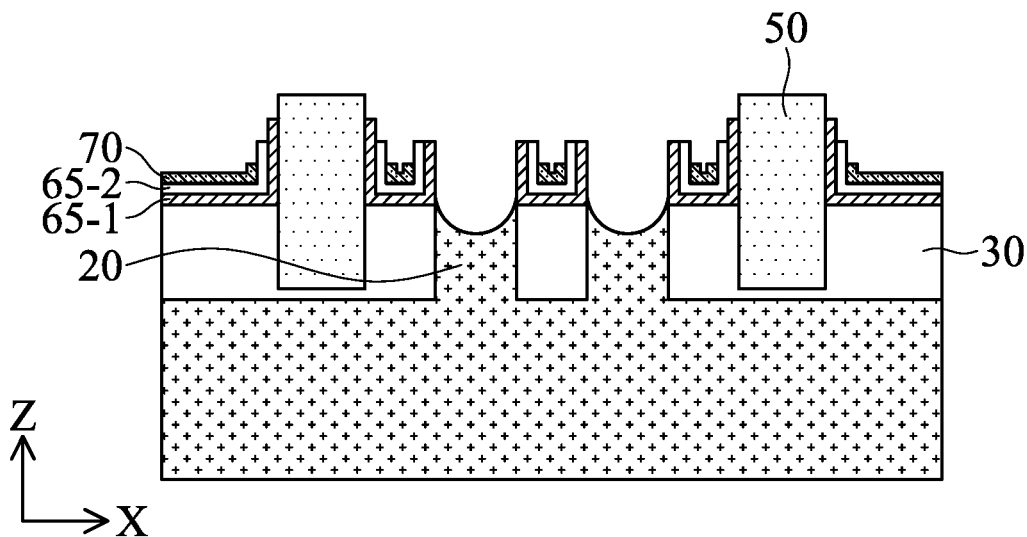
Figure 10C:
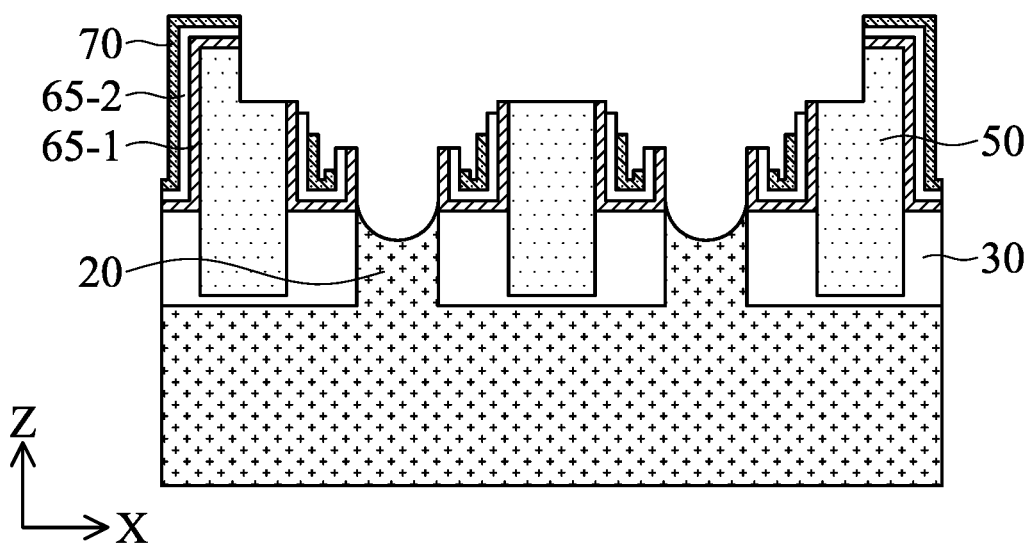

Then, the source/drain region of the fin structures 20 is recessed down below the upper surface of the isolation insulating layer 30 as shown in FIGS. 10A-10C.

Figure 11A:
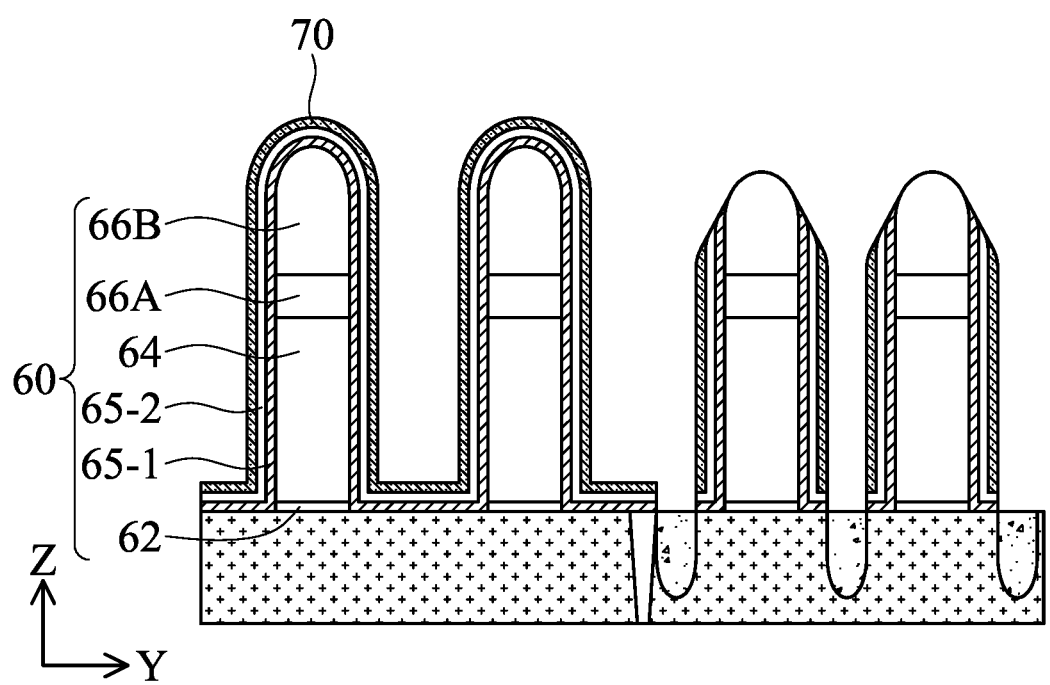
FIGS. 11A, 11B and 11C show cross sectional views of one of the various stages of a manufacturing operation for a semiconductor device according to an embodiment of the present disclosure.
Figure 11B:
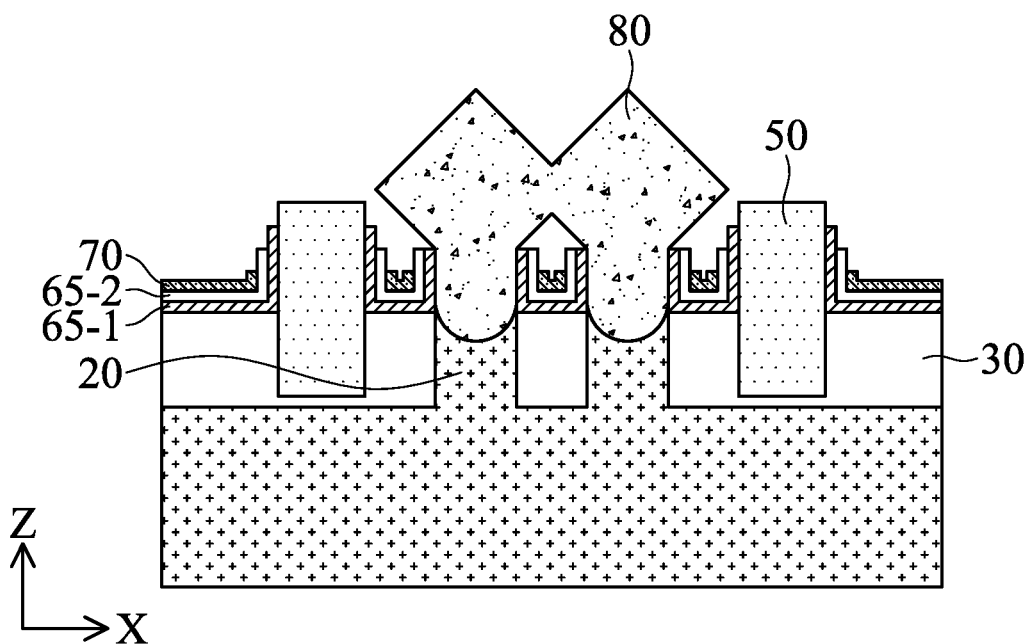
Figure 11C:
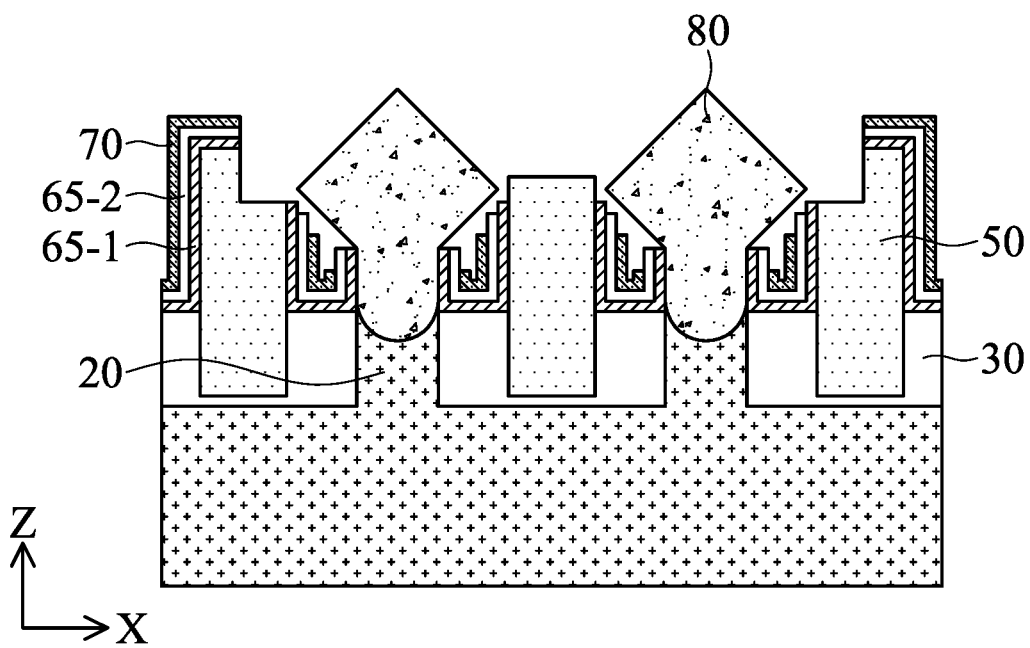

Subsequently, a source/drain epitaxial layer 80 is formed over the recessed in structures 20 as shown in FIGS. 11A-11C. In some embodiments, as explained below, the source/drain epitaxial layer 80 includes one or more epitaxial layers of semiconductor material.

Figure 12A:
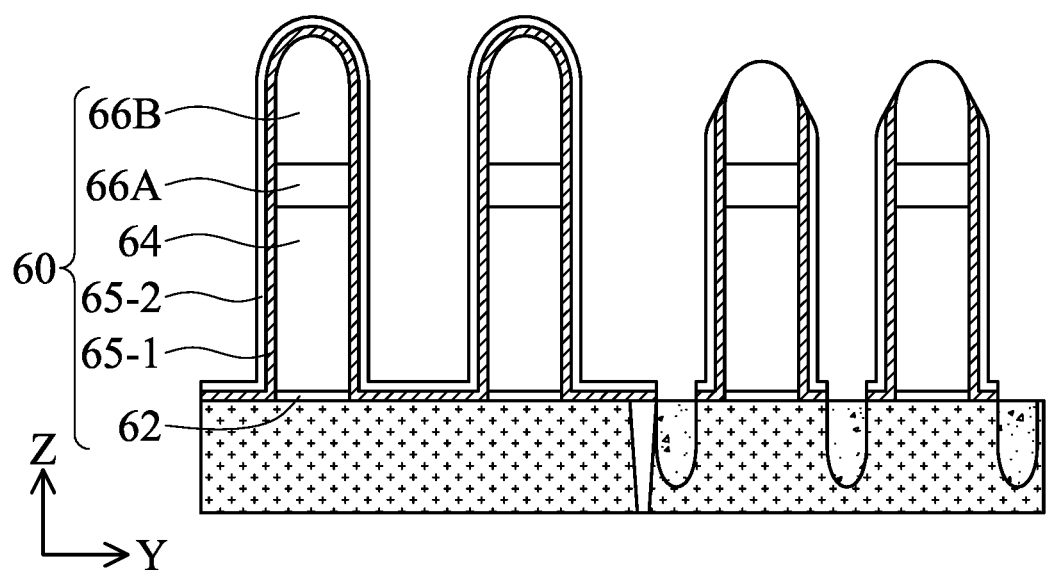
FIGS. 12A, 12B and 12C show cross sectional views of one of the various stages of a manufacturing operation for a semiconductor device according to an embodiment of the present disclosure.
Figure 12B:
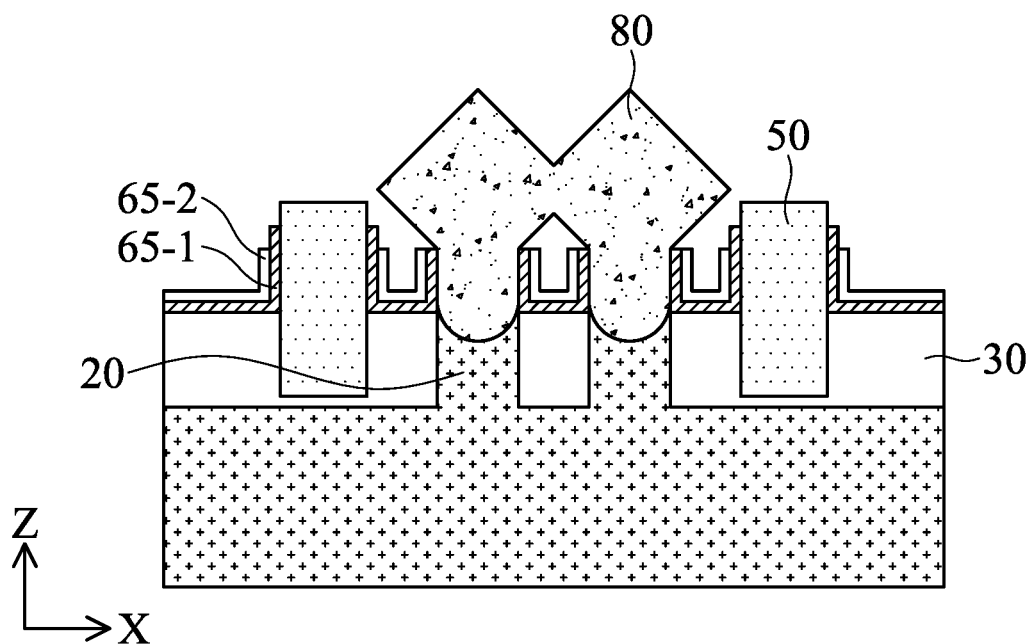
Figure 12C:
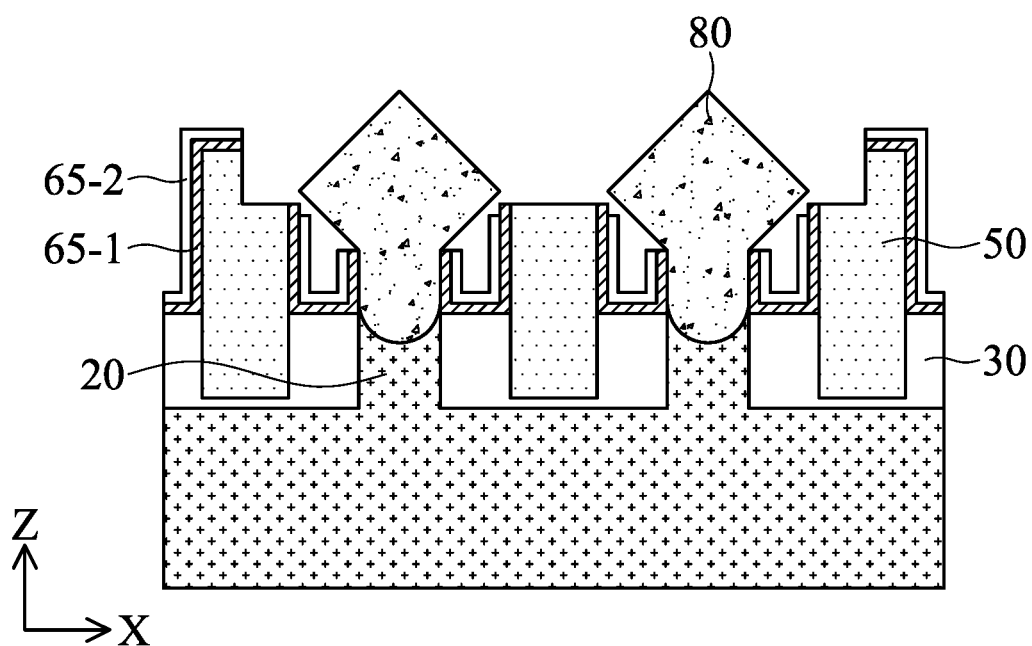

Then, as shown in FIGS. 12A-12C, the cover layer 70 is removed.

In some embodiments, the same or similar operations with respect to FIGS. 7A-12C are performed to form a source/drain epitaxial layer for a p-type FET.

Figure 13:
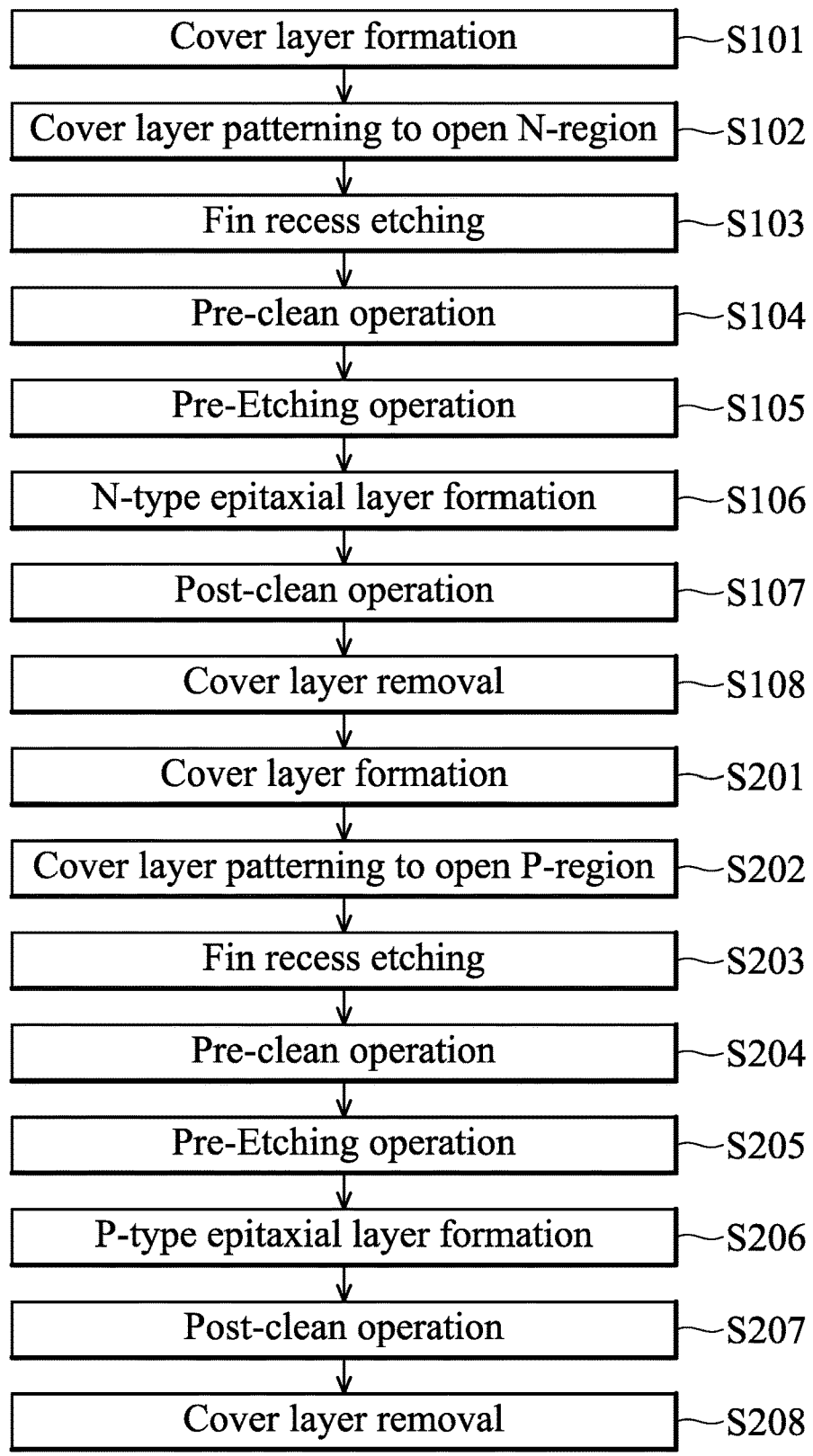
FIG. 13 shows a process flow of a manufacturing operation for a semiconductor device according to an embodiment of the present disclosure.

FIG. 13 shows a process flow and FIGS. 14-26 show various views illustrating the detailed operations for forming a source/drain epitaxial layer for an n-type FET and a p-type FET, subsequent to the manufacturing operations as explained with FIGS. 1-6B, according to the present disclosure. It is understood that additional operations may be provided before, during, and after the processes shown by FIGS. 13 and 14-26, and some of the operations described below can be replaced or eliminated for additional embodiments of the method. The order of the operations/processes may be interchangeable.

Figure 14:
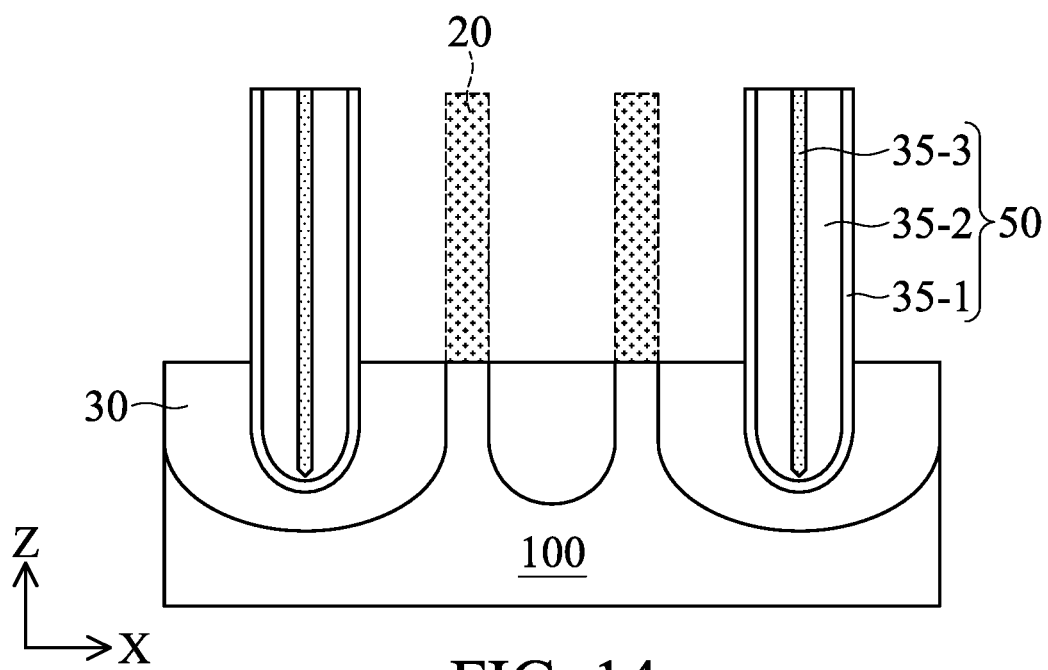
FIG. 14 shows a cross sectional view of one of the various stages of a manufacturing operation for a semiconductor device according to an embodiment of the present disclosure.

FIG. 14 is consistent with FIG. 4, where wall fin structures 50 are formed. In some embodiments, the wall fin structures 50 have a three layer structures including layers 35-1, 35-2 and 35-2 as explained with respect to FIG. 3B. In some embodiments, the fin structure 20 includes a bottom fin structure embedded in the isolation insulating layer 30 and an upper fin structure as a channel region. In some embodiments, the upper fin structure is made of a different semiconductor material than the bottom fin structure and/or the substrate. In some embodiments, the upper fin structure is made of epitaxially formed SiGe.

Figure 15:
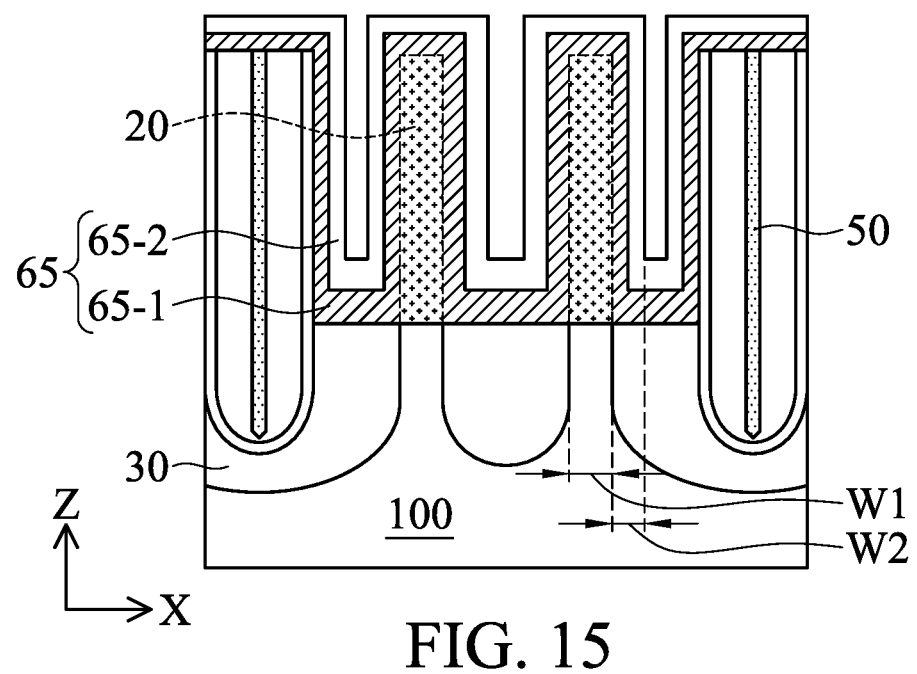
FIG. 15 shows a cross sectional view of one of the various stages of a manufacturing operation for a semiconductor device according to an embodiment of the present disclosure.

FIG. 15 is consistent with FIG. 6B, where the first layer 65-1 and the second layer 65-2 of the sidewall spacer layer 65 are formed.

Figure 16:
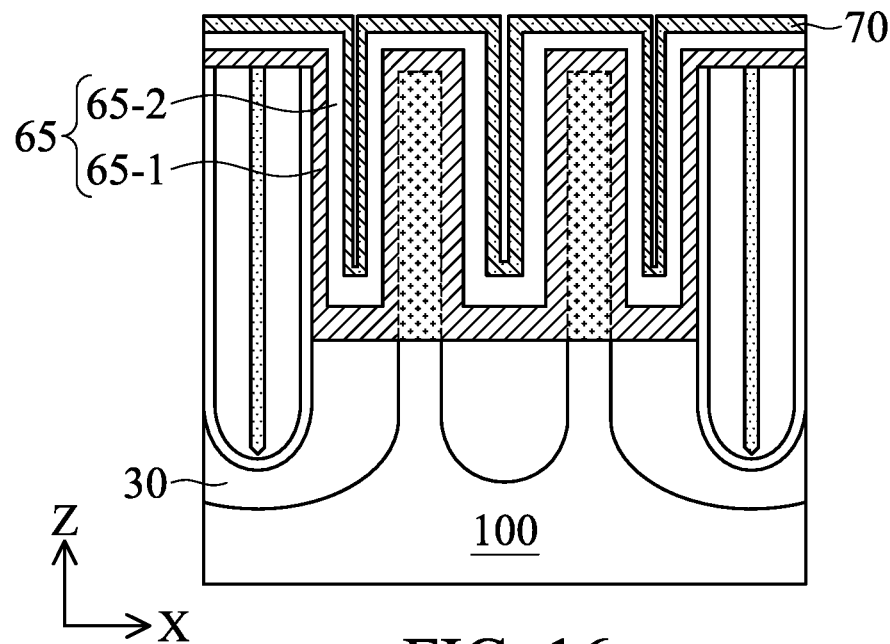
FIG. 16 shows a cross sectional view of one of the various stages of a manufacturing operation for a semiconductor device according to an embodiment of the present disclosure.

Then, at S101 of FIG. 13, as shown in FIG. 16 consistent with FIGS. 7A-7C, a cover layer 70 is formed.

Figure 17:
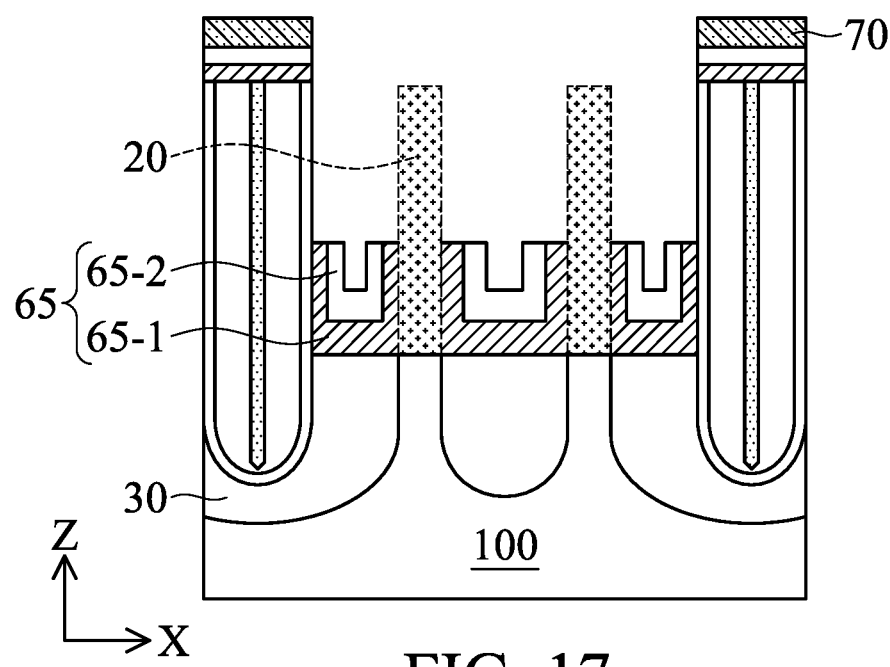
FIG. 17 shows a cross sectional view of one of the various stages of a manufacturing operation for a semiconductor device according to an embodiment of the present disclosure.

Then, at S102, as shown in FIG. 17, the cover layer 70 at the n-type FET region is removed and a part of the sidewall spacer layer 65 is also removed, similar to the operation as explained with respect to FIGS. 7A-7C and 8A-8C.

Figure 18A:
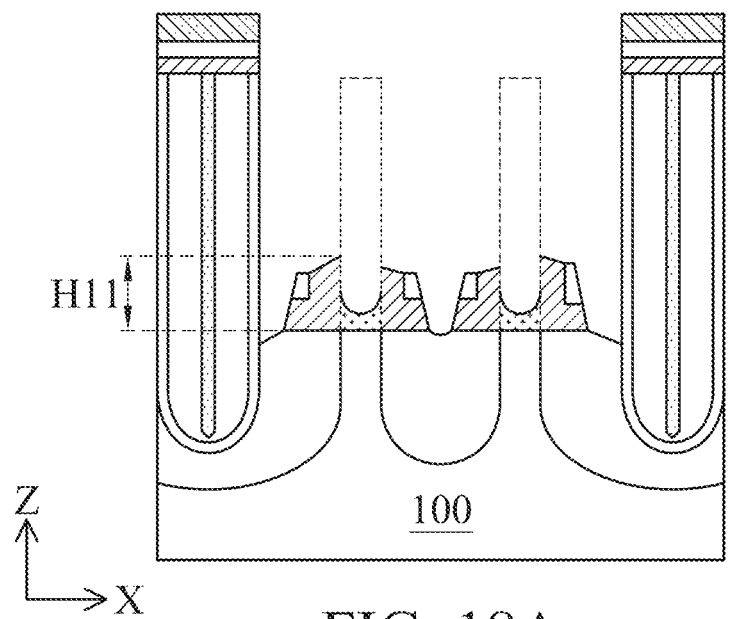
FIGS. 18A and 18B show cross sectional views of one of the various stages of a manufacturing operation for a semiconductor device according to an embodiment of the present disclosure.
Figure 18B:
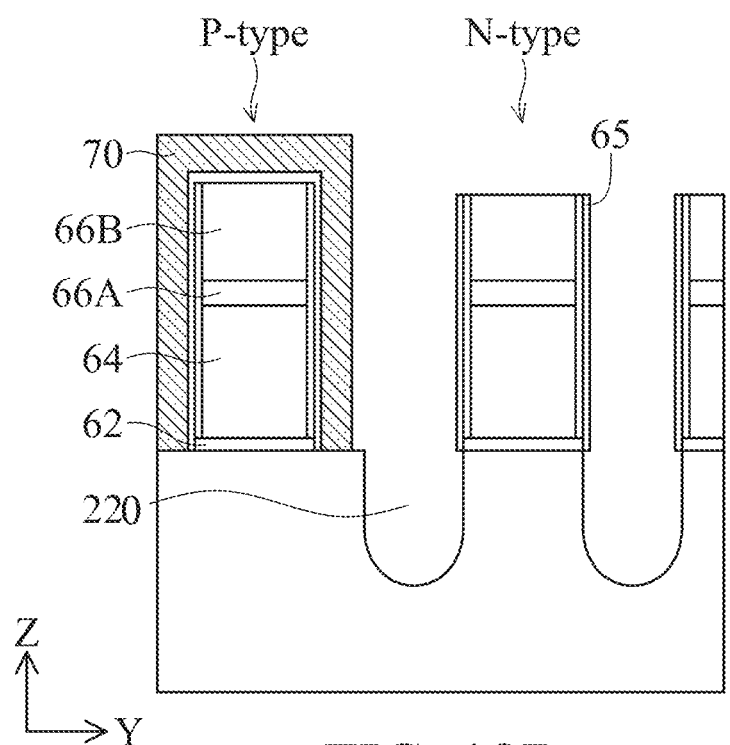

Then, at S103 of FIG. 13, the upper portions of the fin structures 20 (source/drain regions) are recessed by a dry etching and/or a wet etching operation. During the recess etching, a part of the sidewall spacer layer 65 is removed. The upper portion of the fin structures 20 are recessed (etched) down to the level equal to or below the upper surface of the sidewall spacer layer 65, as shown in FIGS. 18A and 18B. FIG. 18A is a cross sectional view along the X direction, and FIG. 18B is a cross sectional view along the Y direction. In some embodiments, the bottom of the recess 220 is located above the upper surface isolation insulating layer 30, and in other embodiments, the bottom of the recess 220 is equal to or below the upper surface isolation insulating layer 30. In some embodiments, the upper surface of the recessed fin structure 20 has a U-shape, a W-shape or a wavy shape.

In some embodiments, a height H11 of the remaining sidewall spacer layer 65 is in a range from about 5 nm to about 20 nm. In some embodiments, depending on the space between adjacent two fin structures and a space between the adjacent two fin structures and another fin structure, the etching of the sidewall spacer layer 65 is asymmetric with respect to the fin structures. In some embodiments, the remaining sidewall spacer layer 65 of one of the two adjacent fin structures on the side facing the other fin structure has a lower height than the remaining sidewall spacer layer 65 of one of the two adjacent fin structures located on the other side. In other embodiments, the height relationship is opposite.

In some embodiments, the recess 220 is formed separately for an n-type FET and a p-type FET. In some embodiments, the recess 220 (and the subsequent epitaxial layer) for an n-type FET is first formed while the region for a p-type FET is covered by a cover layer 70 (e.g., silicon nitride), and then the recess 220 (and the subsequent epitaxial layer) for the p-type FET is formed while the region for the n-type FET is covered by a cover layer.

At S104 of FIG. 13, a pre-clean operation is performed to clean the surface of the recessed fin structure. A pre-clean operation is performed to remove residues (e.g., carbon, fluorine, or chlorine or compounds thereof) on the recessed fin structure and to control the shape of the epitaxial layer.

In some embodiments, plasma etching is used in the pre-clean operation. In some embodiments, the plasma etching is ICP (inductive coupled plasma) using Ar as a source gas. The pressure in the ICP is in a range from about 1 mTorr to about 500 mTorr in some embodiments. The cleaning time is in a range from about 10 seconds to about 40 seconds in some embodiments. If the cleaning time is shorter than about 10 seconds, it is not sufficient to remove residues, and if the cleaning time is greater than about 40 seconds, it may damage the spacer structure and/or the recessed fin structure. In some embodiments, the process temperature is in a range from about 25° C. to 200° C. If the cleaning temperature is lower than the range, residues may not be sufficiently removed, and if the temperature is greater than the range, it may damage the spacer structure and/or the recessed fin structure.

In other embodiments, in the pre-clean process, the source gas is a mixture of Ar and $H_2$ for atomic or ionized hydrogen generation. In some embodiments, the power for the ICP to generate atomic hydrogen ranges from about 2000 W to 4000 W, and a temperature ranges from about 25° C. to 200° C. The hydrogen ions (W) are used to accelerate the reaction and remove of the residue. In other embodiments, the pre-clean operation includes a plasma treatment using Ar and/or $NH_3$ plasma. The process temperature is in a range from about 300° C. to about 600° C. in some embodiments. Other suitable source gases include $H_2O$, HF, $NF_3$, $NH_3$, or combinations thereof.

In the present embodiments, the sidewall spacer layer 65 includes carbon (as SiOCN, SiCN). During the recess etching of the source/drain region of the fin structure 20 as shown in FIGS. 18A and 18B, carbon-based polymer may be formed and deposited on the recessed fin structure. The pre-clean operation can effectively remove such polymer residues.

Then, at S105 of FIG. 13, a pre-etching operation is performed to control the shape of the epitaxial layer subsequently formed. In some embodiments, the upper surface of the recessed fin structures is slightly etched in an amount of about 0.5 nm to about 3 nm. In some embodiments, the pre-etching operation is performed using an HCl gas. In some embodiments, a flow rate of the HCl gas is in a range from about 50 sccm to about 500 sccm. The process temperature is higher than that of the pre-clean operation and is in a range from about 550° C. to about 750° C. in some embodiments and is in a range from about 600° C. to about 700° C. in other embodiments. The etching time is in a range from about 50 seconds to about 100 seconds in some embodiments. If the cleaning time is shorter than about 50 seconds, it is not sufficient to remove residues, and if the cleaning time is greater than about 100 seconds, it may damage the spacer structure and/or the recessed fin structure.

Subsequently, at S106 of FIG. 13, an epitaxial source/drain structure for an n-type FET is formed over the recessed fin structures 20. The epitaxial source/drain structure is made of one or more layers of semiconductor material having a different lattice constant than the fin structures 20 (channel regions).

Figure 19A:
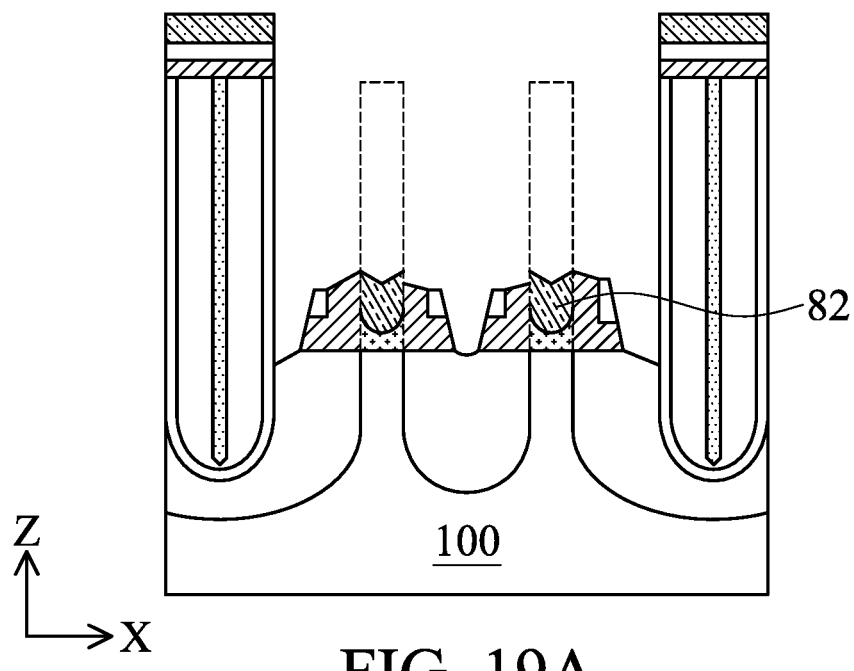
FIGS. 19A and 19B show cross sectional views of one of the various stages of a manufacturing operation for a semiconductor device according to an embodiment of the present disclosure.
Figure 19B:
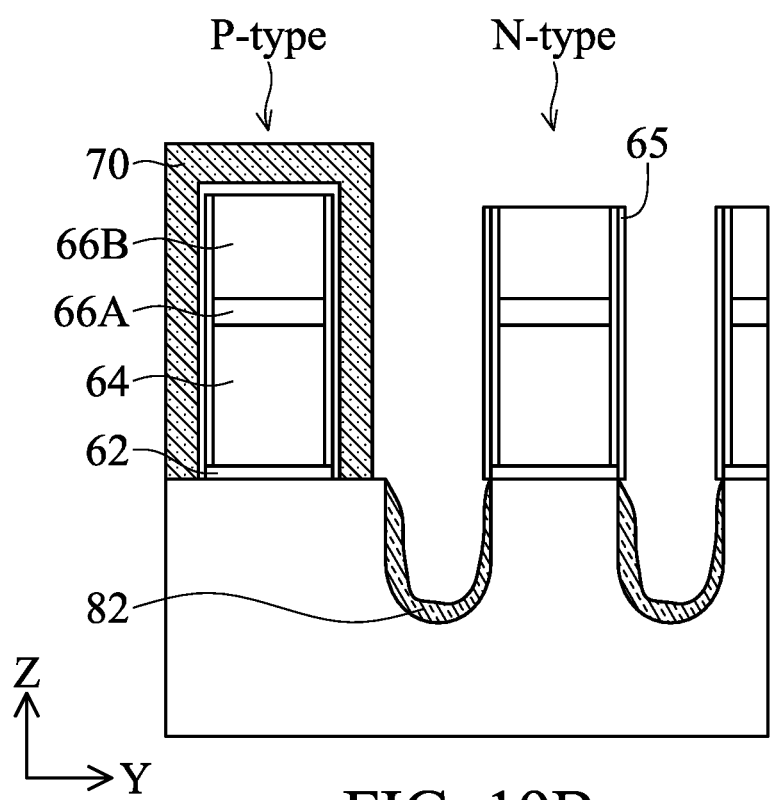
Figure 20A:
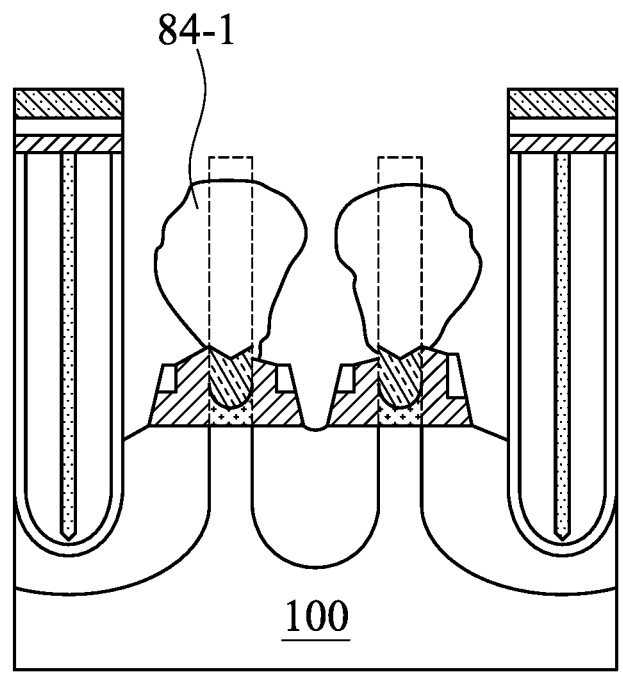
FIGS. 20A and 20B show cross sectional views of one of the various stages of a manufacturing operation for a semiconductor device according to an embodiment of the present disclosure.
Figure 20B:
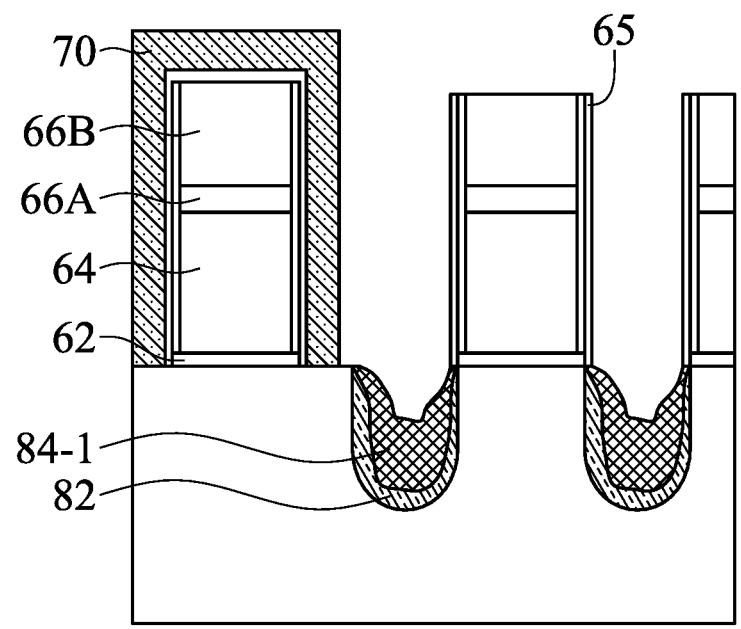

In some embodiments, as shown in FIGS. 19A and 19B, a first epitaxial layer 82 is formed over the recessed fin structure 20. In some embodiments, the first epitaxial layer 82 includes SiAs and/or SiGeAs, which can suppress phosphorous (P) diffusion from the subsequently formed second epitaxial layer to the channel region of the fin structure. In some embodiments, the first epitaxial layer is SiAs formed by using $AsH_3$, HCl, dichlorosilane ($SiH_2Cl_2$) and $H_2$.

In some embodiments, an As concentration in the first epitaxial layer 82 is in a range from about $5\times10^{19}$ atoms/$cm^3$ to about $5\times10^{21}$ atoms/$cm^3$, and is in a range from about $1\times10^{20}$ atoms/$cm^3$ to about $2\times10^{21}$ atoms/$cm^3$ in other embodiments. If the As concentration is too low, a diffusion barrier effect against P is insufficient. It is difficult to include As more than the upper limit of the range, and the high As concentration would diminish stress applied to the channel and increase resistance. The process temperature is equal to or higher than that of the pre-etching operation and is in a range from about 550° C. to about 750° C. in some embodiments and is in a range from about 600° C. to about 700° C. in other embodiments.

In some embodiments, the thickness of the first epitaxial layer 82 is in a range from about 2 nm to about 15 nm, and is in a range from about 3 nm to about 10 nm in other embodiments. If the thickness is too small, a diffusion barrier effect against P is insufficient, and if the thickness is too high, it would diminish stress applied to the channel and increase resistance. In some embodiments, the first epitaxial layer 82 is deposited up to the level equal to or slightly below (less than 2 nm) the top of the remaining sidewall spacer layer 65.

In some embodiments, the epitaxial growth of the first epitaxial layer 82 includes one or more deposition phases and one or more etching phases to control the shape of the epitaxial layer. The deposition and etching phases may be alternatively performed. In the etching phase, an HCl flow rate is higher than that in the deposition phase. In some embodiments, the HCl flow rate in the etching phase is about three to about five time the HCl flow rate in the deposition phase. In some embodiments, the last operation of forming the first epitaxial layer 82 is an etching phase. In some embodiments, the last etching is performed at a temperature equal to or higher than the deposition phase of the first epitaxial layer 82, which is in a range from about 550° C. to about 800° C. In some embodiment, etching time of the last etching is in a range from about 10 seconds to about 40 seconds.

After the first epitaxial layer 82 is formed, the second epitaxial layer 84 including a lower layer 84-1 and an upper layer 84-2 is formed on the first epitaxial layer, as shown in FIGS. 20A, 20B, 21A and 21B. In some embodiments, the second epitaxial layer 84 includes SiP, or SiCP.

In some embodiments, the lower layer 84-1 of the second epitaxial layer 84 is a SiP layer formed by using $PH_3$, HCl, dichlorosilane ($SiH_2Cl_2$) and $H_2$. In some embodiments, a phosphorous (P) concentration in the lower layer 84-1 is in a range from about $2\times10^{20}$ atoms/$cm^3$ to about $5\times10^{21}$ atoms/$cm^3$, and is in a range from about $5\times10^{20}$ atoms/$cm^3$ to about $2\times10^{21}$ atoms/$cm^3$ in other embodiments. If the P concentration is too low, the resistance of the second epitaxial layer increases, and if the P concentration is too high, the stress applied to the channel is diminished. The process temperature is lower than that for the epitaxial growth of the first epitaxial layer and is in a range from about 450° C. to about 650° C. in some embodiments and is in a range from about 500° C. to about 600° C. in other embodiments. In some embodiments, the epitaxial growth of the lower epitaxial layer 64-1 includes one or more deposition phases and one or more etching phases to control the shape of the epitaxial layer. The deposition and etching phases may be alternatively performed. In some embodiments, the deposition phase is longer than the etching phase. In some embodiments, the last operation of forming the epitaxial layer 84-1 is an etching phase. In some embodiments, the last etching is performed at a temperature equal to or higher than the deposition phase of the epitaxial layer 84-1, which is in a range from about 450° C. to about 700° C. In some embodiment, etching time of the last etching is in a range from about 10 seconds to about 40 seconds.

Figure 21A:
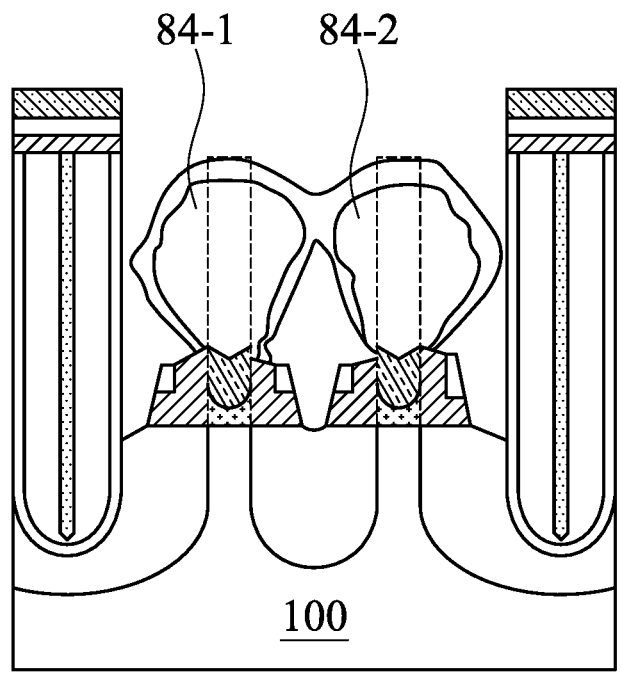
FIGS. 21A and 21B show cross sectional views of one of the various stages of a manufacturing operation for a semiconductor device according to an embodiment of the present disclosure.
Figure 21B:
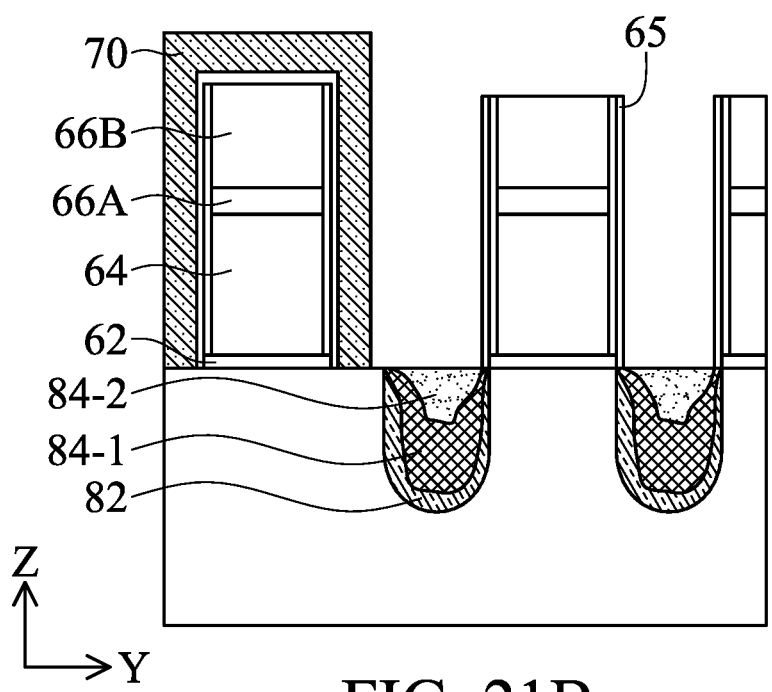

Then, as shown in FIGS. 21A and 21B, the upper layer 84-2 is formed such that the second epitaxial layers of the adjacent fin structures merge with each other by the upper layer 84-2. In some embodiments, the upper layer 84-2 of the second epitaxial layer 84 is a SiP layer formed by using $PH_3$, HCl, silane ($SiH_4$) and $H_2$. In some embodiments, a phosphorous (P) concentration in the upper layer 84-2 is higher than that of the lower layer and is in a range from about $5\times10^{20}$ atoms/$cm^3$ to about $1\times10^{22}$ atoms/$cm^3$, and is in a range from about $1\times10^{21}$ atoms/$cm^3$ to about $5\times10^{21}$ atoms/$cm^3$ in other embodiments. The deposition time for the upper layer 84-2 is equal to or greater than the deposition time for the lower layer 84-1 in some embodiments. The process temperature is higher than that for the epitaxial growth of the lower layer 84-1 and is in a range from about 550° C. to about 750° C. in some embodiments and is in a range from about 600° C. to about 700° C. in other embodiments. The pressure during the deposition of the upper layer 84-2 is lower than that of the lower layer 84-1 in some embodiments. In some embodiments, the thickness of the lower layer 84-1 is in a range from about 10 nm to about 40 nm, and the thickness of the upper layer 84-2 is smaller than that of the lower layer and is in a range from about 5 nm to about 20 nm. The total deposition time for the second epitaxial layer is greater than the deposition time for the first epitaxial layer 82 in some embodiments.

After the upper layer 84-2 is formed, the upper surface of the second epitaxial layer 84 has a wavy shape having an unevenness (peak-to-valley) in a range from about 2 nm to about 10 nm in the Z direction in some embodiments.

In some embodiments, after the etching phase of the lower layer 84-1 is performed, the upper layer 84-2 is formed. During the formation of the upper layer 84-2, no etching phase is included. The total thickness of the second epitaxial layer 84 along the Z direction is in a range from about 15 nm to about 50 nm in some embodiments. In some embodiments, a thickness ratio of the upper layer 84-2 to the lower layer 84-1 along the vertical direction over the first epitaxial layer 82 is in a range from about 0.1 to about 0.3.

Figure 22A:
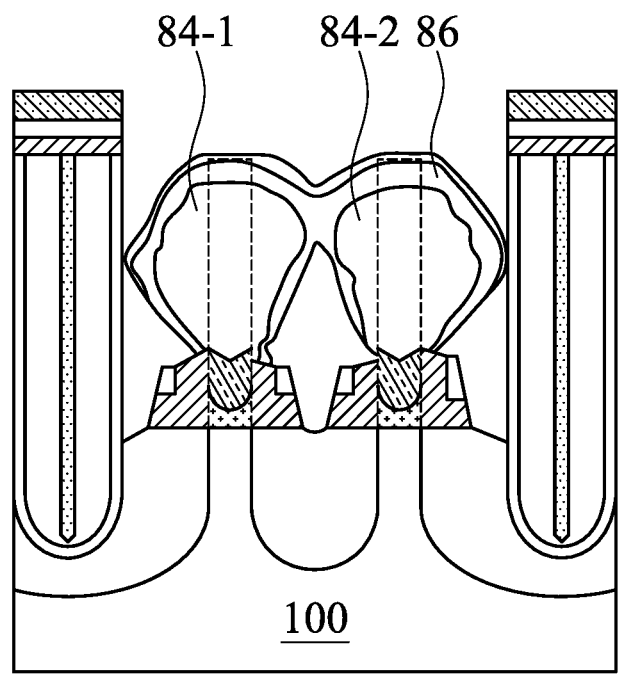
FIGS. 22A and 22B show cross sectional views of one of the various stages of a manufacturing operation for a semiconductor device according to an embodiment of the present disclosure.
Figure 22B:
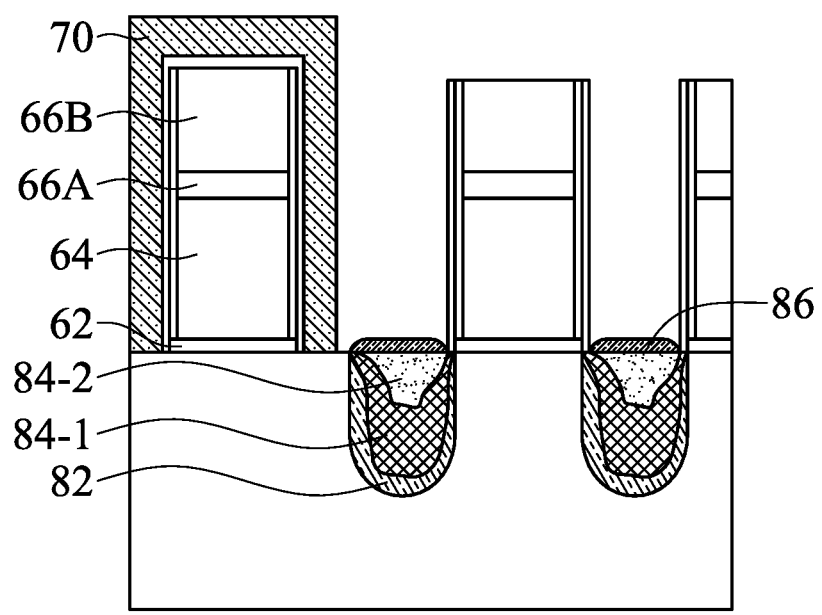

Then, as shown in FIGS. 22A and 22B, a third epitaxial layer 86 is formed on the second epitaxial layer 84. In some embodiments, the third epitaxial layer 86 includes SiP, or SiCP. In some embodiments, a phosphorous (P) concentration in the third epitaxial layer 86 is equal to or smaller than that in the second epitaxial layer 84, and is in a range from about $2\times10^{20}$ atoms/$cm^3$ to about $1\times10^{22}$ atoms/$cm^3$, and is in a range from about $5\times10^{20}$ atoms/$cm^3$ to about $5\times10^{21}$ atoms/$cm^3$ in other embodiments. If the P concentration is too low, a resistance of the second epitaxial layer increases, and if the P concentration is too high, it would diminish stress applied to the channel. The process temperature is higher than that for the epitaxial growth of the upper layer 84-2 and is in a range from about 550° C. to about 750° C. in some embodiments and is in a range from about 600° C. to about 700° C. in other embodiments.

In some embodiments, after the third epitaxial layer 84 is formed, the third epitaxial layer is treated by $GeH_4$ gas to control phosphorous out-diffusion and to reduce contact resistance for a subsequently formed source/drain contact, and thus the third epitaxial layer 86 further contains Ge. In some embodiments, a Ge concentration in the third epitaxial layer 86 is in a range from about 0.5 atomic % to about 10 atomic %, and is in a range from about 1.0 atomic % to about 5 atomic % in other embodiments. A small amount of Ge contributes to TiSi formation and reduces contact resistance, and when the amount is too small, such an effect may not be obtained. When the Ge concentration is too high, it induces Ge agglomeration during TiSi formation and increases contact resistance and defects, and also diminishes stress in the epitaxial layers. The process temperature of $GeH_4$ etching is higher than that for the epitaxial growth of the third epitaxial layer 86 and is in a range from about 650° C. to about 850° C. in some embodiments and is in a range from about 700° C. to about 800° C. in other embodiments.

In some embodiments, the epitaxial growth of the third epitaxial layer 86 includes one or more deposition phases and one or more etching phases that control the shape of the epitaxial layer, which may be alternatively performed. The thickness of the third epitaxial layer along the Z direction is in a range from about 3 nm to about 10 nm in some embodiments. If the thickness is too small, a desired shape of the epitaxial layers would not be obtained. If the thickness is too large, it would induce merging with nearby devices (either NFET or PFET) and it would also diminish the wavy shape. In some embodiments, the third epitaxial layer 86 fully covers the surface of the second epitaxial layer 84 except for the gap between two fin structures, and touches the first epitaxial layer 82. In some embodiments, the first and third epitaxial layers sandwiching the second epitaxial layer suppress out-diffusion of phosphorous from the second epitaxial layer to the channel region or a metal gate electrode.

Subsequently, at S107 of FIG. 13, a post-clean operation is performed by using He and/or $H_2$ gas, which is a non-plasma operation (e.g., chemical etching/cleaning) in some embodiments. The post-cleaning operation helps to remove residual Si grown over the sacrificial gate structures or the sidewall spacer layers. In some embodiments, the post-cleaning operation slightly etches the epitaxial layer 80 in an amount of about 1 nm to about 3 nm (about 2-10% of the thickness of the second and third epitaxial layers). The process temperature of the post-clean operation is lower than that for the epitaxial growth of the epitaxial layer 80, and is in a range from about 25° C. to about 200° C. in some embodiments. In some embodiments, the operations of S104-S107 are performed in a same process chamber without exposing to atmosphere. At S108 of FIG. 13, the cover layer 70 is removed as explained with respect to FIGS. 12A-12C.

Then, the same or similar operations are performed at S201-S208 of FIG. 13 to form a source/drain structure for a p-type FET. One of ordinary skill in the art would readily understand that the structures shown by FIGS. 14-22B are applicable to the p-type FET process except for the epitaxial layer materials and some dimensions.

At S201 of FIG. 13, similar to FIG. 16 and FIGS. 7A-7C, a cover layer is formed to cover the n-type FET regions with the source/drain epitaxial layer and the p-type FET regions. Then, at S202, similar to FIGS. 7A-7C, 8A-8C and 17, the cover layer at the p-type FET region is removed and a part of the sidewall spacer layer is also removed.

Then, at S203 of FIG. 13, the upper portions of the fin structures (source/drain regions) are recessed by a dry etching and/or a wet etching operation similar to FIGS. 18A and 18B.

At S204 of FIG. 13, a pre-clean operation is performed to clean the surface of the recessed fin structure. The conditions of the pre-clean operation for the p-type FET regions are the same as the conditions of the pre-clean operation for the n-type FET regions as set forth above.

Then, at S205 of FIG. 13, a pre-etching operation is performed to control the shape of the epitaxial layer subsequently formed. The conditions of the pre-etching operation for the p-type FET regions are the same as the conditions of the pre-etching operation for the n-type FET regions as set forth above.

Subsequently, at S206 of FIG. 13, an epitaxial source/drain structure for the p-type FET is formed over the recessed fin structures. The epitaxial source/drain structure is made of one or more layers of semiconductor material having a different lattice constant than the fin structures 20 (channel regions).

In some embodiments, similar to FIGS. 19A and 19B, a first epitaxial layer, corresponding to layer 82, is formed over the recessed fin structure. In some embodiments, the first epitaxial layer includes SiGe doped with B (SiGe:B). In some embodiments, the first epitaxial layer is SiGe:B formed by using $B_2H_6$, HCl, dichlorosilane ($SiH_2Cl_2$) or $SiH_4$, $GeH_2Cl_2$, $Ge_2H_6$ or $GeH_4$ and $H_2$. The process conditions of forming the first epitaxial layer for the p-type FET are the same as the conditions for forming the first epitaxial layer for the n-type FET as set forth above. In some embodiments, the thickness of the first epitaxial layer is in a range from about 2 nm to about 20 nm, and is in a range from about 3 nm to about 10 nm in other embodiments.

After the first epitaxial layer is formed, the second epitaxial layer includes a lower layer and an upper layer, corresponding to layers 84, 84-1 and 84-2, is formed on the first epitaxial layer, similar to FIGS. 20A, 20B, 21A and 21B. In some embodiments, the second epitaxial layer includes SiGe:B having a higher Ge concentration than the first epitaxial layer.

In some embodiments, the Ge concentration of the upper layer is greater than the Ge concentration of the lower layer. The process conditions for forming the second epitaxial layer for the p-type FET are the same as the conditions for forming the second epitaxial layer for the n-type FET as set forth above. In some embodiments, the thickness of the lower layer is in a range from about 10 nm to about 40 nm, and the thickness of the upper layer is smaller than that of the lower layer and is in a range from about 5 nm to about 20 nm.

Then, similar to FIGS. 22A and 22B, a third epitaxial layer, corresponding to layer 86, is formed on the second epitaxial layer. In some embodiments, the third epitaxial layer includes SiGe:B having a higher Ge concentration than the second epitaxial layer. The process conditions for forming the third epitaxial layer for the p-type FET are the same as the conditions for forming the third epitaxial layer for the n-type FET as set forth above. In some embodiments, the thickness of the third epitaxial layer is in a range from about 3 nm to about 10 nm. In some embodiments, no $GeH_4$ gas is applied after the third epitaxial layer is formed.

Subsequently, at S207 of FIG. 13, a post-clean operation is performed by using He and/or $H_2$ gas, which is a non-plasma operation (e.g., chemical etching/cleaning) in some embodiments. The conditions for the post-clean operation for the p-type FET regions are the same as the conditions for the post-clean operation for the n-type FET regions as set forth above.

In some embodiments, the operations of S204-S207 are performed in a same process chamber without exposing to atmosphere. At S208 of FIG. 13, the cover layer is removed.

Figure 23:
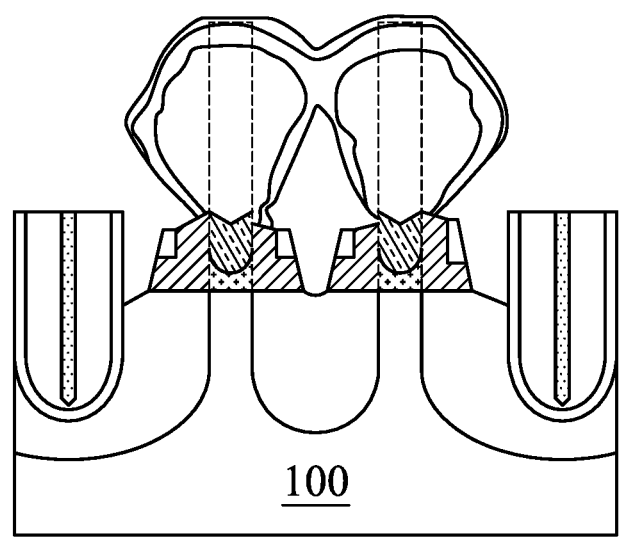
FIG. 23 shows a cross sectional view of one of the various stages of a manufacturing operation for a semiconductor device according to an embodiment of the present disclosure.

In some embodiments, after the cover layer is removed at S208, the wall fin structures 50 are partially recessed as shown in FIG. 23. In some embodiments, during the removal of the cover layer at S108 and/or S208, the wall fin structure 50 are also partially removed to reduce the height thereof.

Figure 24:
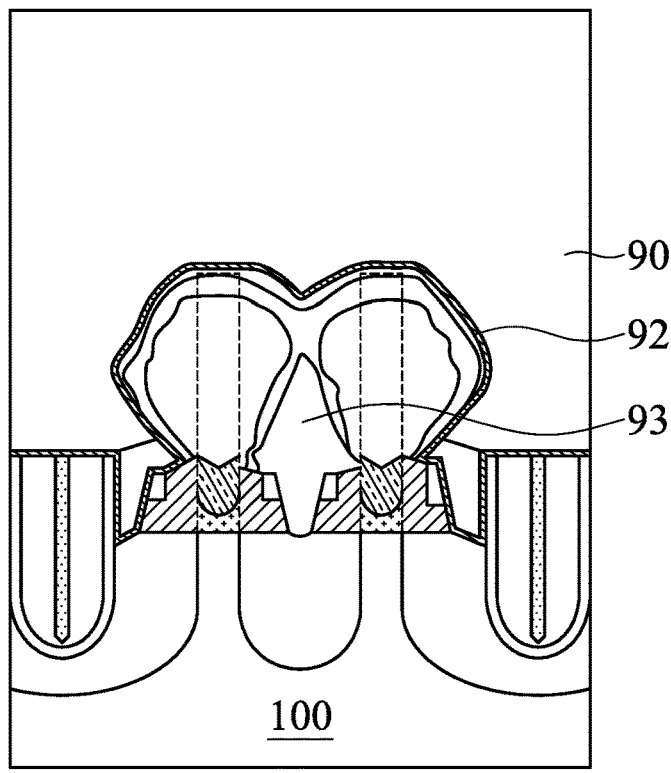
FIG. 24 shows a cross sectional view of one of the various stages of a manufacturing operation for a semiconductor device according to an embodiment of the present disclosure.

Subsequently, an insulating layer 92, functioning as a contact etching stop layer, is formed over the source/drain structures 80, and then an interlayer dielectric (ILD) layer 90 is formed as shown in FIG. 24. The ILD layer 90 is one or more layers of insulating material. In one embodiment, the etching stop layer is made of silicon nitride formed by CVD. The materials for the ILD layer 90 include compounds comprising Si, O, C and/or H, such as silicon oxide, SiCOH and SiOC. Organic materials, such as polymers, may be used for the ILD layer 90. In some embodiments, a gap or a void 93 is formed below the merger point of the source/drain epitaxial layer 80.

In some embodiments, after the ILD layer 90 is formed, a metal gate structure is formed by using a gate replacement technology. After forming the ILD layer 90, a CMP operation is performed to expose the dummy gate electrode. The dummy gate structures (dummy gate electrode and dummy gate dielectric layer) are then removed and replaced with a metal gate structure (metal gate electrode and gate dielectric layer). After the metal gate structure is formed, one or more interlayer dielectric layer is formed over the metal gate structure and the ILD layer in some embodiments. The interlayer dielectric layers are collectively referred to as ILD layer 90 in FIG. 24.

Figure 25:
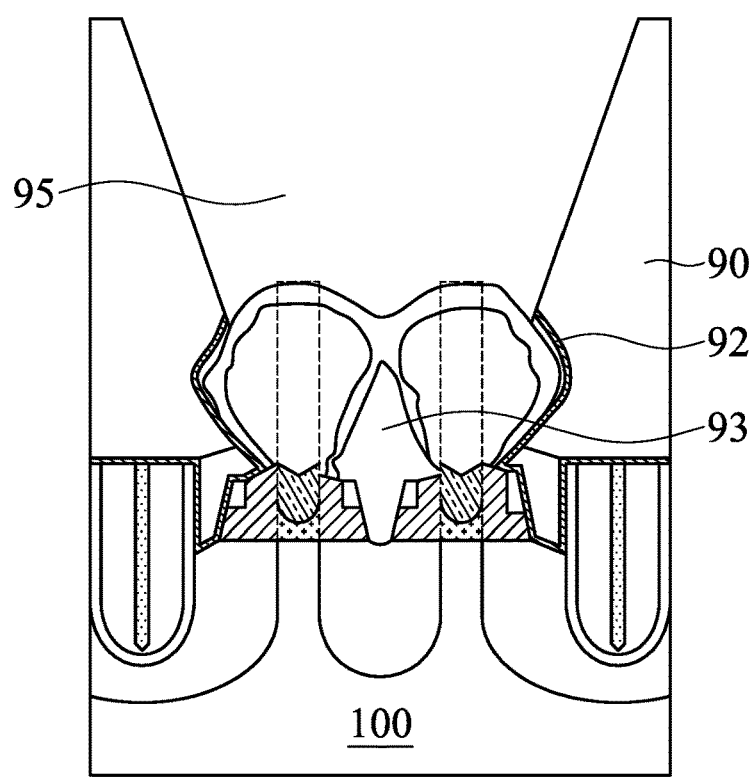
FIG. 25 shows a cross sectional view of one of the various stages of a manufacturing operation for a semiconductor device according to an embodiment of the present disclosure.

Next, by using a patterning operation including lithography, a contact hole 95 is formed in the interlayer dielectric layer 90 to expose the epitaxial source and drain structures 80, as shown in FIG. 25. In some embodiments, an upper surface of the source/drain epitaxial layer 80 (the third epitaxial layer 86) is partially etched in an amount of about 2 nm to about 10 nm.

Figure 26A:
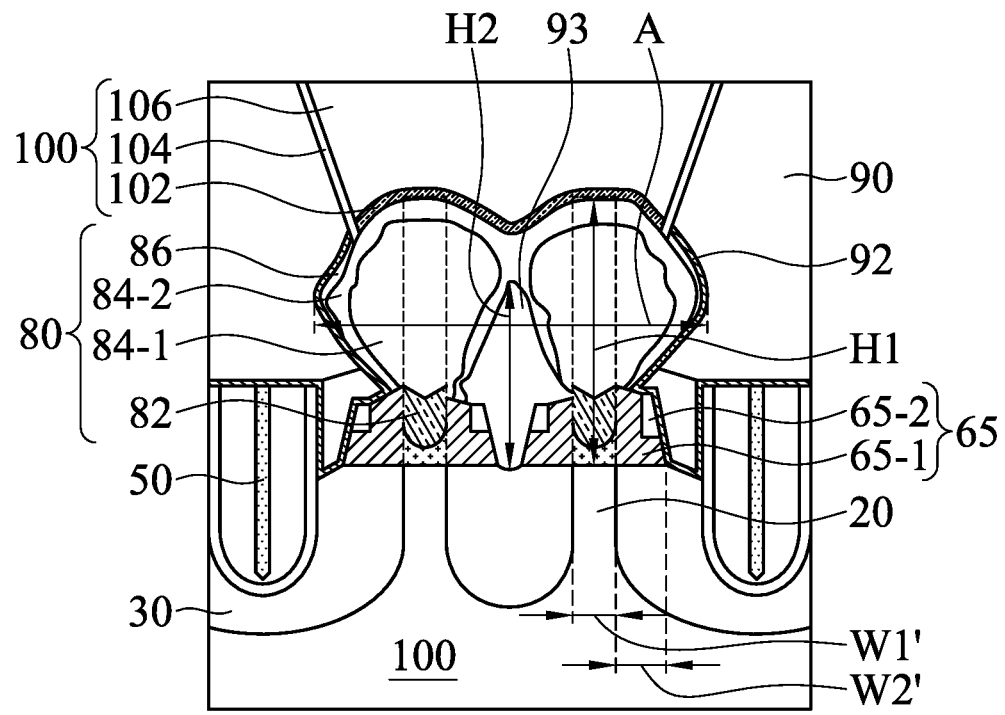
FIGS. 26A and 26B shows cross sectional views of one of the various stages of a manufacturing operation for a semiconductor device according to an embodiment of the present disclosure.
Figure 26B:
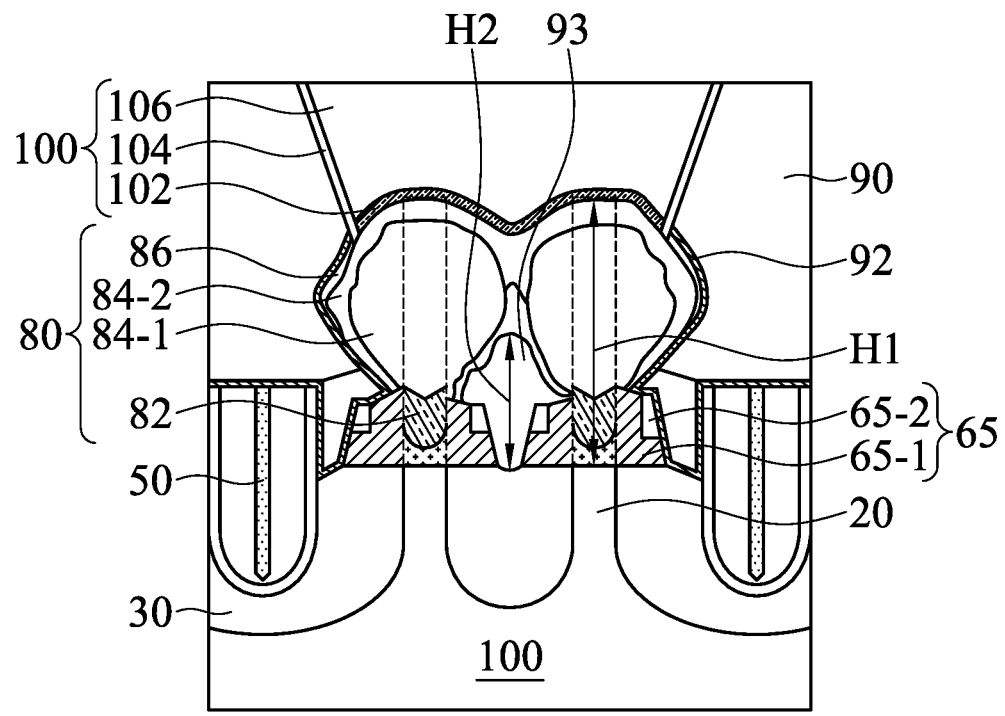

Then, the contact hole 95 is filled with a conductive material, thereby forming a contact plug 100, as shown in FIGS. 26A and 26B. FIG. 26A is an n-type FET and FIG. 26B is a p-type FET. In some embodiments, the contact plug 100 includes a silicide layer 102, a barrier or adhesion layer 104 and a body layer 106, as shown in FIGS. 26A and 26B. The silicide layer 102 (or silicide-germanide layer for the p-type FET) is formed by a reaction between one or more metals formed over the source/drain epitaxial layer and the material of the source/drain epitaxial layer 80. In some embodiments, the silicide layer 102 includes NiSi, TiSi, TaSi and/or WSi. The barrier layer 104 includes one or more of Ti, Ta, TiN, TaN, WN or any suitable material. The body layer is a single layer or multiple layers of any suitable metal such as Co, W, Ti, Ta, Cu, Al and/or Ni and/or alloy thereof.

In some embodiments, the height H1 of the source/drain epitaxial layer 80 (the top of the third epitaxial layer 86) from the upper surface of the isolation insulating layer 30 is in a range from about 40 nm to about 100 nm. In some embodiments, the height H2 of the bottom of the merger point A (the highest point of the gap 93) from the upper surface of the isolation insulating layer 30 is in a range from about 20 nm to about 50 nm for an n-type FET and is in a range from about 2 nm to about 10 nm for a p-type FET. In some embodiments, H2 for the p-type FET is smaller than H2 for the n-type FET FIGS. 26A and 26B. In some embodiments, the merger point of the n-type FET is located above a level where the n-type source/drain epitaxial layer has a maximum width "A" as shown in FIG. 26A.

In some embodiments, the thickness W2' of the sidewall spacer layer 65 (the combination of layers 65-1 and 65-2) is greater than the width W1' of the fin structure. In some embodiments, the width W1' is measured at the same level as the upper surface of the isolation insulating layer and the thickness W2' is measured at a level same as the horizontal interface between the first layer 65-1 and the second layer 65-2.

In some embodiments, W2'/W1' is in a range from about 1.1 to about 4.0. Such a relatively thick sidewall spacer layer suppress damage on the sidewall spacers during etching thereon and effectively protect the sacrificial gate electrode layer. Although carbon polymer residue may occur, the pre-clean operation can effectively remove the residue. If the thickness of the sidewall spacer layer 65 is smaller than this range, protection of the sacrificial gate electrode may be diminished, and if the thickness is greater than this range, a volume of the source/drain epitaxial layer 80 may be decreased.

After forming the contact plug, further CMOS processes are performed to form various features such as additional interlayer dielectric layers, contacts/vias, interconnect metal layers, and passivation layers, etc.

Figure 27:
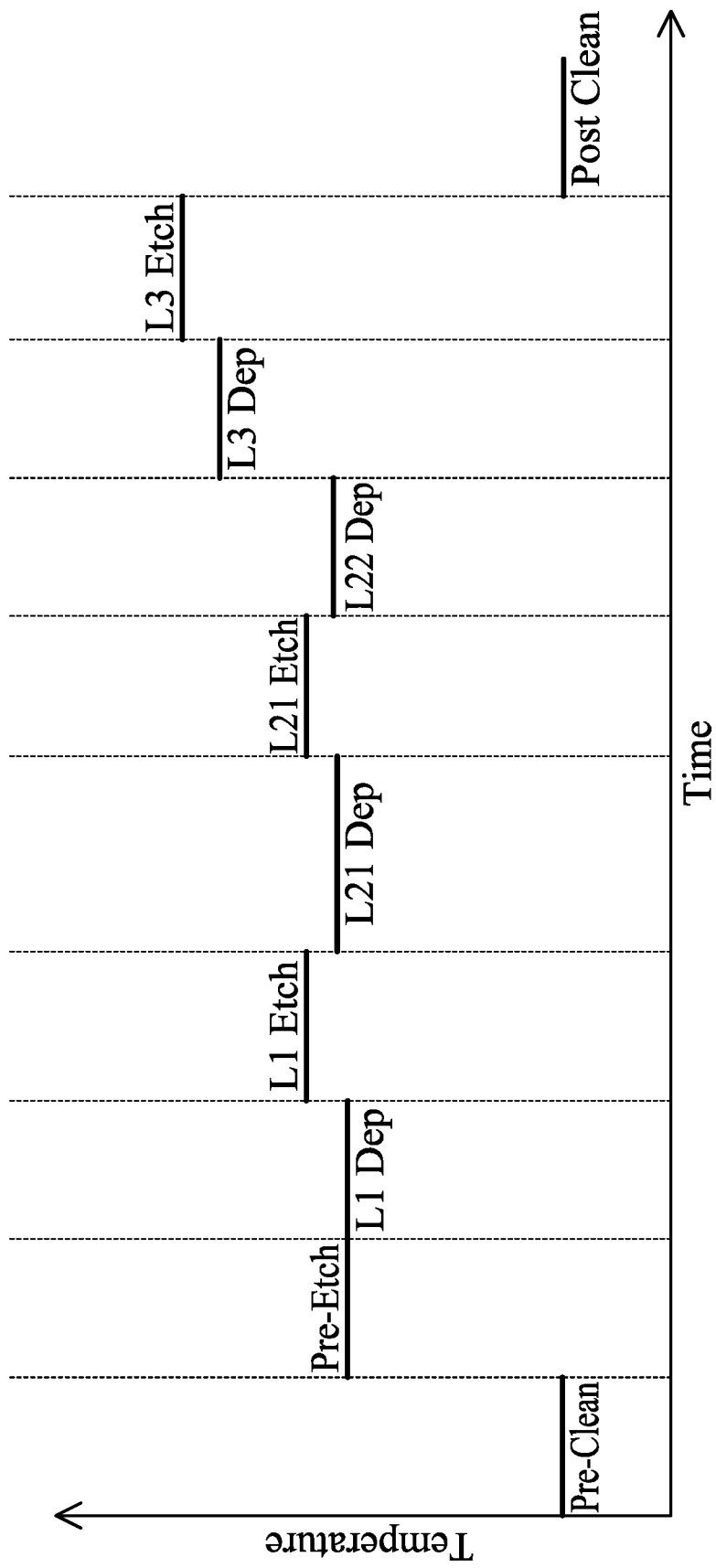
FIG. 27 shows a process flow of forming source/drain epitaxial layer according to an embodiment of the present disclosure.

FIG. 27 shows process times and process temperatures for forming the source/drain epitaxial layer 80 according to embodiments of the present disclosure. In FIG. 27, "L1" corresponds to the first epitaxial layer 82, "L21" corresponds to the lower layer 84-1 of the second epitaxial layer 84, "L22" corresponds to the upper layer 84-2 of the second epitaxial layer 84 and "L3" corresponds to the third epitaxial layer 86. The temperature is a substrate temperature in some embodiments.

In the pre-clean operation, the cleaning time is in a range from about 10 seconds to about 40 seconds, and the process temperature is in a range from about 25° C. to 200° C. in some embodiments. In the pre-etch operation, the etching time is in a range from about 50 seconds to about 100 seconds in some embodiments. The process temperature is higher than that of the pre-clean operation and is in a range from about 550° C. to about 750° C. in some embodiments and is in a range from about 600° C. to about 700° C. in other embodiments. In the deposition of L1 layer, the process temperature is equal to or higher than that of the pre-etching operation and is in a range from about 550° C. to about 750° C. in some embodiments and is in a range from about 600° C. to about 700° C. in other embodiments. The deposition time depends on the desired thickness of the L1 layer. In the L1 etching operation, the etching is performed at a temperature equal to or higher than the deposition of L1 layer, which is in a range from about 550° C. to about 800° C. In some embodiment, etching time of the etching is in a range from about 10 seconds to about 40 seconds.

In L21 deposition, the process temperature is equal to or lower than that for the epitaxial growth of L1 layer and is in a range from about 450° C. to about 650° C. in some embodiments and is in a range from about 500° C. to about 600° C. in other embodiments. The deposition time depends on the desired thickness of the L21 layer. In the L21 etching operation, the etching is performed at a temperature equal to or higher than the deposition of L1 layer, which is in a range from about 450° C. to about 700° C. In some embodiment, etching time of the etching is in a range from about 10 seconds to about 40 seconds.

In L22 deposition, the process temperature is higher than that for the epitaxial growth of L21 layer and is in a range from about 550° C. to about 750° C. in some embodiments and is in a range from about 600° C. to about 700° C. in other embodiments. The deposition time depends on the desired thickness of the L22 layer.

In L3 deposition, the process temperature is higher than that for the epitaxial growth of L22 layer and is in a range from about 550° C. to about 750° C. in some embodiments and is in a range from about 600° C. to about 700° C. in other embodiments. The deposition time depends on the desired thickness of the L3 layer. In L3 etching, which includes a GeH$_4$ gas treatment (etching), the process temperature of L3 etching is higher than that for the epitaxial growth of L3 layer and is in a range from about 650° C. to about 850° C. in some embodiments and is in a range from about 700° C. to about 800° C. in other embodiments. In some embodiment, etching time of the etching is in a range from about 10 seconds to about 40 seconds.

In the post-clean operation, the process temperature of the post-clean operation is lower than that for the epitaxial growth of L1, L21, L22 and L3 layers, and is in a range from about 25° C. to about 200° C. in some embodiments. In some embodiment, treatment time of the post-clean operation is in a range from about 10 seconds to about 40 seconds.

Although foregoing embodiments describe a FinFET, the technologies disclosed in the present disclosure are also applicable to other types of FETs, such as a planar FET and a nanostructure FET using a nanostructure (e.g. nanowire, nanosheet, etc.) semiconductor.

In the foregoing embodiments, since sacrificial gate electrode layer is covered by thick dielectric layers (sidewall spacers), the sacrificial gate electrode is effectively protected during etching operations on the source/drain regions. Further, the thick dielectric layers include carbon, the dielectric constant of the sidewall spacers can be reduced, which can improve device performance by reducing parasitic capacitance. In addition, any resides from the carbon containing sidewall spacers can be effectively removed by pre-clean and pre-etching operations before the epitaxial growth of the source/drain structures, and thus the shape and/or volume of the source/drain epitaxial layers can be improved.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a first fin structure and a second fin structure are formed, and a first wall fin structure and a second wall fin structure are formed over a substrate, so that the first fin structure and the second fin structure are disposed between the first wall fin structure and the second wall fin structure, and lower portions of the first and second fin structure and the first and second wall fin structures are embedded in an isolation insulating layer and upper portions of the first and second fin structures and the first and second wall fin structures are exposed from the isolation insulating layer. A sidewall spacer layer is formed on sidewalls of the first and second fin structures and the first and second wall fin structures. Source/drain regions of the first and second fin structure are recessed. An epitaxial source/drain structure is formed over the recessed first and second fin structures. A width W1 of the first and second fin structures is smaller than a thickness W2 of the sidewall spacer layer. In one or more of the foregoing and following embodiments, W2 is in a range from 1.1×W1 to 4.0×W1. In one or more of the foregoing and following embodiments, the sidewall spacer layer includes a first dielectric layer and a second dielectric layer formed over the first dielectric layer and made of a different material than the first dielectric layer. In one or more of the foregoing and following embodiments, the first dielectric layer is made of SiOCN. In one or more of the foregoing and following embodiments, a carbon concentration of the first dielectric layer is in a range from 6 atomic % to 18 atomic %, and an oxygen concentration of the first dielectric layer is in a range from 20 atomic % to 45 atomic %. In one or more of the foregoing and following embodiments, the second dielectric layer is made of SiCN. In one or more of the foregoing and following embodiments, the second dielectric layer includes a first SiCN layer and a second SiCN layer formed over the first SiCN layer, wherein the second SiCN layer and having a higher nitrogen concentration than the first SiCN layer In accordance with another aspect of the present disclosure, in a method of manufacturing a semiconductor device, a first fin structure and a second fin structure and a first wall fin structure and a second wall fin structure are formed over a substrate, so that the first fin structure and the second fin structure are disposed between the first wall fin structure and the second wall fin structure, and lower portions of the first and second fin structure and the first and second wall fin structures are embedded in an isolation insulating layer and upper portions of the first and second fin structures and the first and second wall fin structures are exposed from the isolation insulating layer. A sidewall spacer layer is formed on sidewalls of the first and second fin structures and the first and second wall fin structures, wherein the sidewall spacer layer contains carbon. Source/drain regions of the first and second fin structure are recessed. A pre-clean operation is performed on the recessed source/drain regions of the first and second fin structures to remove residue comprising carbon. After the pre-clean operation, a pre-etching operation is performed on the recessed source/drain regions of the first and second fin structures to etch a surface of the recessed source/drain regions of the first and second fin structures. An epitaxial source/drain structure is formed over the recessed first and second fin structures. In one or more of the foregoing and following embodiments, the pre-clean operation comprises plasma treatment. In one or more of the foregoing and following embodiments, a source gas of the plasma treatment is one of Ar or a mixture of Ar and H$_2$. In one or more of the foregoing and following embodiments, the pre-clean operation is performed at a temperature in a range from 25° C. to 200° C. In one or more of the foregoing and following embodiments, a source gas of the pre-etch operation includes HCl. In one or more of the foregoing and following embodiments, the pre-clean operation is performed at a temperature in a range from 550° C. to 750° C. In one or more of the foregoing and following embodiments, after the epitaxial source/drain structure is formed, a post-clean operation is performed to remove silicon residue. In one or more of the foregoing and following embodiments, a source gas of the post-clean operation includes at least one of He or H2. In one or more of the foregoing and following embodiments, the post-clean operation is performed at a temperature in a range from 25° C. to 200° C.

In accordance with another aspect of the present disclosure, in a method of manufacturing a semiconductor device including an n-type FET and a p-type FET. Each of the n-type FET and the p-type FET is formed at least by the following operations. A first fin structure and a second fin structure and a first wall fin structure and a second wall fin structure are formed over a substrate, so that the first fin structure and the second fin structure are disposed between the first wall fin structure and the second wall fin structure, and lower portions of the first and second fin structure and the first and second wall fin structures are embedded in the isolation insulating layer and upper portions of the first and second fin structures and the first and second wall fin structures are exposed from the isolation insulating layer. Source/drain regions of the first and second fin structure are recessed. An epitaxial source/drain structure is formed over the recessed first and second fin structures. The epitaxial source/drain structure is a merged structure having a merger point, and a height of a bottom of the merger point from an upper surface of the isolation insulating layer of the p-type FET is smaller than a height of a bottom of the merger point from the upper surface of the isolation insulating layer of the n-type FET. In one or more of the foregoing and following embodiments, the first and second wall fin structures are recessed before the epitaxial source/drain structure is formed. In one or more of the foregoing and following embodiments, each of first and second wall fin structures includes three layers of different dielectric materials. In one or more of the foregoing and following embodiments, a top of the recessed first and second wall fin structures is located below the merger point.

In accordance with another aspect of the present disclosure, a semiconductor device includes an isolation insulating layer disposed over a substrate; a first fin structure and a second fin structure disposed over the substrate; a source/drain epitaxial layer disposed over source/drain regions of the first and second fin structures; and a sidewall spacer layer disposed on a bottom of the source/drain epitaxial layer. A width W1 of the first and second fin structures is smaller than a thickness W2 of the sidewall spacer layer. In one or more of the foregoing and following embodiments, W2 is in a range from 1.1×W1 to 4.0×W1. In one or more of the foregoing and following embodiments, the sidewall spacer layer includes a first dielectric layer and a second dielectric layer formed over the first dielectric layer and made of a different material than the first dielectric layer. In one or more of the foregoing and following embodiments, the first dielectric layer is made of SiOCN. In one or more of the foregoing and following embodiments, a carbon concentration of the first dielectric layer is in a range from 6 atomic % to 18 atomic %, and an oxygen concentration of the first dielectric layer is in a range from 20 atomic % to 45 atomic %. In one or more of the foregoing and following embodiments, the second dielectric layer is made of SiCN. In one or more of the foregoing and following embodiments, the second dielectric layer includes a first SiCN layer and a second SiCN layer formed over the first SiCN layer and having a higher nitrogen concentration than the first SiCN layer.

In accordance with another aspect of the present disclosure, a semiconductor device includes an isolation insulating layer disposed over a substrate; a first fin structure and a second fin structure disposed over the substrate; a source/drain epitaxial layer disposed over source/drain regions of the first and second fin structures; and a sidewall spacer layer disposed on a bottom of the source/drain epitaxial layer. The sidewall spacer layer include multiple layers each contains at least silicon and carbon, and the source/drain epitaxial layer includes a first epitaxial layer disposed over each of the source/drain regions of the first and second fin structures, a second epitaxial layer disposed over the first epitaxial layer and forming a merged structure, and a third epitaxial layer disposed over the second epitaxial layer. In one or more of the foregoing and following embodiments, the first epitaxial layer includes SiAs with an As concentration in a range from $1 \times 10^{20}$ atoms/cm$^3$ to $2 \times 10^{21}$ atoms/cm$^3$. In one or more of the foregoing and following embodiments, the second and third epitaxial layers includes SiP having different P concentration, and the third epitaxial layer further contains Ge. In one or more of the foregoing and following embodiments, a P concentration of the second epitaxial layer is in a range from $5 \times 10^{20}$ atoms/cm$^3$ to $5 \times 10^{21}$ atoms/cm$^3$. In one or more of the foregoing and following embodiments, a top of the first epitaxial layer is located below a top of the sidewall spacer layer. In one or more of the foregoing and following embodiments, the sidewall spacer layer includes a first dielectric layer and a second dielectric layer formed over the first dielectric layer and made of a different material than the first dielectric layer. In one or more of the foregoing and following embodiments, the first dielectric layer is made of SiOCN and the second dielectric layer is made of SiCN. In one or more of the foregoing and following embodiments, the second dielectric layer includes a first SiCN layer and a second SiCN layer formed over the first SiCN layer and having a higher nitrogen concentration than the first SiCN layer.

In accordance with another aspect of the present disclosure, a semiconductor device includes an n-type FET and a p-type FET. The n-type FET includes a first fin structure and a second fin structure, bottom portions of which are embedded in an isolation insulating layer; an n-type source/drain epitaxial layer disposed over source/drain regions of the first and second fin structures; and a first sidewall spacer layer disposed on a bottom of the n-type source/drain epitaxial layer. The p-type FET includes a third fin structure and a fourth fin structure bottom portions of which are embedded in the isolation insulating layer; a p-type source/drain epitaxial layer disposed over source/drain regions of the third and fourth fin structures; and a second sidewall spacer layer disposed on a bottom of the p-type source/drain epitaxial layer. Each of the n-type source/drain epitaxial layer and p-type source/drain epitaxial layer has a merged structure having a merger point, and a height of a bottom of the merger point from an upper surface of the isolation insulating layer of the p-type FET is smaller than a height of a bottom of the merger point from the upper surface of the isolation insulating layer of the n-type FET. In one or more of the foregoing and following embodiments, the merger point of the n-type FET is located above a level where the n-type source/drain epitaxial layer has a maximum width. In one or more of the foregoing and following embodiments, each of the first and second sidewall spacer layers includes a first dielectric layer containing carbon and a second dielectric layer containing carbon formed over the first dielectric layer and made of a different material than the first dielectric layer. In one or more of the foregoing and following embodiments, the first dielectric layer is made of SiOCN and the second dielectric layer is made of SiCN. In one or more of the foregoing and following embodiments, the second dielectric layer includes a first SiCN layer and a second SiCN layer formed over the first SiCN layer and having a higher nitrogen concentration than the first SiCN layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first fin structure and a second fin structure and forming a first wall fin structure and a second wall fin structure over a substrate, so that the first fin structure and the second fin structure are disposed between the first wall fin structure and the second wall fin structure, and lower portions of the first and second fin structures and the first and second wall fin structures are embedded in an isolation insulating layer and upper portions of the first and second fin structures and the first and second wall fin structures are exposed from the isolation insulating layer;
    forming a sidewall spacer layer on sidewalls of the first and second fin structures and the first and second wall fin structures, wherein:
    the sidewall spacer layer includes a first dielectric layer and a second dielectric layer formed over the first dielectric layer and made of a different material than the first dielectric layer,
    the first dielectric layer is made of SiOCN, and
    a carbon concentration of the first dielectric layer is in a range from 6 atomic % to 18 atomic %, and an oxygen concentration of the first dielectric layer is in a range from 20 atomic % to 45 atomic %;
    recessing source/drain regions of the first and second fin structures; and
    forming an epitaxial source/drain structure over the recessed first and second fin structures,
    wherein a width W1 of the first and second fin structures is smaller than a thickness W2 of the sidewall spacer layer.

2. The method of claim 1, wherein W2 is in a range from 1.1×W1 to 4.0×W1.

3. The method of claim 1, wherein the second dielectric layer now abandoned is made of SiCN.

4. The method of claim 1, wherein the second dielectric layer includes a first SiCN layer and a second SiCN layer formed over the first SiCN layer, wherein the second SiCN layer has a higher nitrogen concentration than the first SiCN layer.

5. A method of manufacturing a semiconductor device, the method comprising:
    forming a first fin structure and a second fin structure and forming a first wall fin structure and a second wall fin structure over a substrate, so that the first fin structure and the second fin structure are disposed between the first wall fin structure and the second wall fin structure, and lower portions of the first and second fin structures and the first and second wall fin structures are embedded in an isolation insulating layer and upper portions of the first and second fin structures and the first and second wall fin structures are exposed from the isolation insulating layer;
    forming a sidewall spacer layer on sidewalls of the first and second fin structures and the first and second wall fin structures, wherein the sidewall spacer layer contains carbon;
    recessing source/drain regions of the first and second fin structures;
    performing a pre-clean operation on the recessed source/drain regions of the first and second fin structures to remove residue comprising carbon;
    after the pre-clean operation, performing a pre-etching operation on the recessed source/drain regions of the first and second fin structures to etch a surface of the recessed source/drain regions of the first and second fin structures; and
    forming an epitaxial source/drain structure over the recessed first and second fin structures.

6. The method of claim 5, wherein the pre-clean operation comprises a plasma treatment.

7. The method of claim 6, wherein a source gas of the plasma treatment is one of Ar or a mixture of Ar and $H_2$.

8. The method of claim 7, wherein the pre-clean operation is performed at a temperature in a range from 25° C. to 200° C.

9. The method of claim 5, wherein a source gas of the pre-etch operation includes HCl.

10. The method of claim 9, wherein the pre-clean operation is performed at a temperature in a range from 550° C. to 750° C.

11. The method of claim 5, further comprising, after the epitaxial source/drain structure is formed, performing a post-clean operation to remove silicon residue.

12. The method of claim 11, wherein a source gas of the post-clean operation includes at least one of He or $H_2$.

13. The method of claim 12, wherein the post-clean operation is performed at a temperature in a range from 25° C. to 200° C.

14. A method of manufacturing a semiconductor device including an n-type FET and a p-type FET, each of the n-type FET and the p-type FET being formed at least by:
    forming a first fin structure and a second fin structure and forming a first wall fin structure and a second wall fin structure over a substrate, so that the first fin structure and the second fin structure are disposed between the first wall fin structure and the second wall fin structure, and lower portions of the first and second fin structures and the first and second wall fin structures are embedded in an isolation insulating layer and upper portions of the first and second fin structures and the first and second wall fin structures are exposed from the isolation insulating layer;
    recessing source/drain regions of the first and second fin structure; and
    forming an epitaxial source/drain structure over the recessed first and second fin structures,
    wherein the epitaxial source/drain structure is a merged structure having a merger point, and
    a height of a bottom of the merger point from an upper surface of the isolation insulating layer of the p-type FET is smaller than a height of a bottom of the merger point from the upper surface of the isolation insulating layer of the n-type FET.

15. The method of claim 14, wherein the first and second wall fin structures are recessed before the epitaxial source/drain structure is formed.

16. The method of claim 15, wherein each of first and second wall fin structures includes three layers of different dielectric materials.

17. The method of claim 15, wherein a top of the recessed first and second wall fin structures is located below the merger point.

18. The method of claim 14, further comprising forming a sidewall spacer layer on sidewalls of the first and second fin structures and the first and second wall fin structures.

19. The method of claim 18, wherein the sidewall spacer layer includes a first dielectric layer and a second dielectric layer formed over the first dielectric layer and made of a different material than the first dielectric layer.

20. The method of claim 19, wherein the first dielectric layer is made of SiOCN.

* * * * *